United States Patent
Arikan

(10) Patent No.: US 10,404,291 B2
(45) Date of Patent: Sep. 3, 2019

(54) METHOD AND SYSTEM FOR ERROR CORRECTION IN TRANSMITTING DATA USING LOW COMPLEXITY SYSTEMATIC ENCODER

(71) Applicant: Polaran Yazilim Bilisim Danismanlik Ithalat Ihracat Sanayi Ticaret Limited Sirketi, Bilkent, Cankaya, Ankara (TR)

(72) Inventor: Erdal Arikan, Ankara (TR)

(73) Assignee: Polaran Yazilim Bilisim Danismanlik Ithalet Ihracat Sanayi Ticaret Limited Sirketi, Ankara (TR)

(*) Notice: Subject to any disclaimer, the term of this patent is extended or adjusted under 35 U.S.C. 154(b) by 0 days.

(21) Appl. No.: 15/826,335

(22) Filed: Nov. 29, 2017

(65) Prior Publication Data
US 2019/0165887 A1 May 30, 2019

(51) Int. Cl.
*H04L 1/00* (2006.01)
*H03M 13/00* (2006.01)
(Continued)

(52) U.S. Cl.
CPC .......... *H03M 13/616* (2013.01); *H03M 13/05* (2013.01); *H03M 13/1148* (2013.01);
(Continued)

(58) Field of Classification Search
CPC ............. H03M 13/616; H03M 13/615; H03M 13/6522; H03M 13/1148; H03M 13/13; H03M 13/05; H04L 1/0058; H04L 1/0041
See application file for complete search history.

(56) References Cited

U.S. PATENT DOCUMENTS

| 8,347,186 B1 | 1/2013 | Arikan |
| 9,059,739 B2 * | 6/2015 | Arikan .................. H03M 13/13 |

(Continued)

FOREIGN PATENT DOCUMENTS

WO    WO-2018124779 A1 *  7/2018  ............... H04L 1/00

OTHER PUBLICATIONS

Arikan, E., "Channel Polarization: A Method for Constructing Capacity-Achieving Codes for Symmetric Binary-Input Memoryless Channels," IEEE Transactions on Information Theory, vol. 55, No. 7, Jul. 20, 2009, 23 pages.
(Continued)

*Primary Examiner* — Cynthia Britt

(57) ABSTRACT

A systematic polar encoder with data checks includes a data mapper receiving input data containing information to be polar coded for transmission and generating modified data, and a nonsystematic polar encoder implementing a transform matrix encoding the modified data to produce a codeword x such that, for some sub-sequence of coordinates S, $x_S=d$. For nonsystematic encoding, a transform input u includes first and second parts for words independent of the data, the second part for an inverse puncture word, a third part carrying the modified data, and a non-null part carrying a check word derived from the modified data. A transform output includes a punctured part for a puncture word, a part carrying the data, and a part serving as redundant symbols, with the codeword x related to the transform output by $x=z_Q$ where Q is the complement of the punctured part P.

27 Claims, 10 Drawing Sheets

(51) Int. Cl.
*H03M 13/05* (2006.01)
*H03M 13/11* (2006.01)
*H03M 13/13* (2006.01)

(52) U.S. Cl.
CPC ......... *H03M 13/13* (2013.01); *H03M 13/615*
(2013.01); *H03M 13/6522* (2013.01); *H04L*
*1/0041* (2013.01); *H04L 1/0058* (2013.01)

(56) References Cited

U.S. PATENT DOCUMENTS

| | | | |
|---|---|---|---|
| 9,148,177 B2* | 9/2015 | Arikan | H03M 13/13 |
| 2015/0077277 A1* | 3/2015 | Alhussien | H03M 13/618 |
| | | | 341/67 |
| 2015/0236715 A1* | 8/2015 | Alhussien | H03M 7/40 |
| | | | 341/67 |
| 2015/0295593 A1* | 10/2015 | Trifonov | H03M 13/3746 |
| | | | 714/776 |
| 2016/0013810 A1 | 1/2016 | Gross et al. | |

OTHER PUBLICATIONS

Arikan, E., "Systematic Polar Coding," IEEE Communications Letters, vol. 15, No. 8, Aug. 2011, pp. 860-862.
Chen, G., et al., "A Low Complexity Encoding Algorithm for Systematic Polar Codes," IEEE Communications Letters, Feb. 2016, 4 pages.
Feng, B., et al., "An Efficient Rateless Scheme Based on the Extendibility of Systematic Polar Codes," IEEE Access, vol. 4, 2016, 11 pages.
"Polar Code Construction," 3GPP TSG RAN WG1 NR Ad-Hoc #2, R1-1709995, Huawei and HiSilicon, Qingdao, China, Jun. 27-30, 2017, 4 pages.
"Parity Check Bits for Polar Code," 3GPP TSG RAN WG1 NR Ad-Hoc #2, R1-1709996, Huawei and HiSilicon, Qingdao, China, Jun. 27-30, 2017, 5 pages.
"Polar Code Design and Rate Matching," 3GPP TSG RAN WG1 Meeting #86, R1-167209, Huawei and HiSilicon, Gothenburg, Sweden, Aug. 22-26, 2016, 5 pages.
"Simple Distributed CRC Design for Polar Codes," 3GPP TSG RAN WG1 Meeting NR-Adhoc#2, R1-1711347, Intel Corporation, Qingdao, China, Jun. 27-30, 2017, 5 pages.
Mohammad, S., et al., "Simple Hybrid ARQ Schemes Based on Systematic Polar Codes for IoT Applications," IEEE Communications Letters, 5 pages.
Sarkis, G., et al., "Fast Polar Decoders: Algorithim and Implementation," IEEE Journal on Selected Areas in Communications, vol. 32, No. 5, Dec. 9, 2013, 11 pages.
Sarkis, G., et al., "Flexible and Low-Complexity Encoding and Decoding of Systematic Polar Codes," IEEE Transactions on Communications, vol. 64, No. 7, Feb. 2016, 13 pages.
Tai, I., et al., "List of Decoding of Polar Codes," IEEE Information on Information Technology, vol. 61, No. 5, May 31, 2012, 11 pages.
Vangala, H., et al., "Efficient Algorithim for Systematic Polar Encoding," IEEE Communications Letters, vol. 20, No. 1, Jan. 2016, 4 pages.
Wang, et al., "A Novel Puncturing Scheme for Polar Codes," IEEE Communication Letters, vol. 18, No. 12, Dec. 2014, 2081-2084 pages.
Wu, D., et al., "Parallel Concentrated Systematic Polar Codes," Electronic Letters, vol. 52, No. 1, Jan. 8, 2016, pp. 43-45.
ISA/EPO, International Search Report and Written Opinion of the International Searching Authority for International Application No. PCT/IB2018/059373, dated Mar. 4, 2019, 19 pages.
Chen, Guo Tai, et al., "A Low Complexity Encoding Algorithm for Systematic Polar Codes," Submitted to IEEE Communications Letters, Feb. 2016, 4 pages.
Feng, Hongjun, et al., "A Practical CRCs-ADSCL Decoding Scheme for Systematic Polar Codes," 2016 8th International Conference on Wireless Communications & Signal Processing (WCSP), IEEE, Oct. 13, 2016, 5 pages.
Niu, Kai, et al., "Rate-Compatible Punctured Polar Codes: Optimal Construction Based on Polar Spectra," arciv.org, Cornell University, Dec. 5, 2016, 14 pages.
Nokia, et al., "Rate matching for Polar codes," R1-1711543, 3GPP TSG RAN WG1 NR Ad-Hoc #2, Qingdao, P.R. China, Jun. 27-30, 2017, 5 pages.
Sarkis, Gabi, et al., "Fast Polar Decoders: Algorithm and Implementation," IEEE Journal on Selected Areas in Communications, vol. 32, No. 5, May 2014, 12 pages.
Shin, Dong-Min, et al., "Design of Length-Compatible Polar Codes Based on the Reduction of Polarizing Matrices," IEEE Transactions on Communications, vol. 61, No. 7, Jul. 2013, 7 pages.

\* cited by examiner

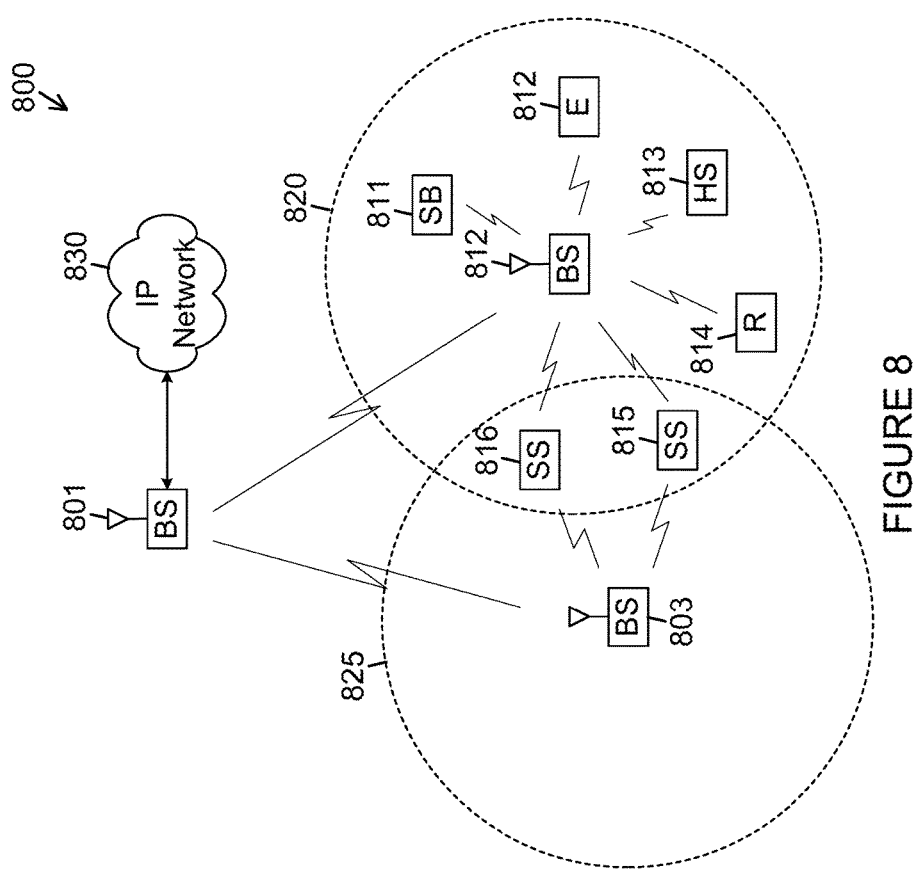

METHOD AND SYSTEM FOR ERROR CORRECTION IN TRANSMITTING DATA USING LOW COMPLEXITY SYSTEMATIC ENCODER

TECHNICAL FIELD

The present application relates generally to error correction and, more specifically, to providing a low complexity systematic encoder for error correction in transmitting data using polar codes.

BACKGROUND

In modern digital data transmission (wireless telephony, wireless data transmission, optical disk transmission to a player, music players receiving music data, and so on), a source encoder can compress the data to be transmitted for efficiency and then a channel encoder can receive the compressed data and add redundancy to it to protect the data against noise in the transmission channel. The receiver (sometimes referred to as the "sink") at the other end of the channel receives the encoded data and uses a channel decoder to perform the inverse of channel encoding, followed by a source decoder which performs the inverse of source encoding. The decoded information is then played by the sink, e.g., by an optical disk player or music player or receiving telephone as audio, or is otherwise used and/or stored by the receiver.

Present principles focus on channel encoding for transmission of data that possibly contain redundancies introduced purposefully to improve the chances of recovery from error at the receiver. Channel encoding typically works by sending a piece of data sought to be communicated, referred to as a "data word," through a transformation to produce a "codeword" that is better protected against errors than the data word from which it is derived, and thus is more suitable for transmission than the data word. For present purposes suffice it to say that linear block encoders, which multiply a data word using a matrix, have been used for this purpose because they are able to achieve an acceptable tradeoff of offering significant (albeit not absolute) protection against noise, commonly expressed in terms of the error rates such as bit error rates (BER) that result from noise, while being of sufficiently "low complexity" in terms of the amount of computation they require. Higher complexity encoding schemes that reduce the BER of a received signal but require too much computation for expected data transmission rates are of little practical use.

A newer type of linear block code is the polar code, which improves on older codes by being able to achieve channel capacity, i.e., by being able to encode data such that the full capacity of the transmission channel can be exploited. Channel polarization refers to the fact that given a binary-input discrete memoryless channel W with symmetric capacity I(W), it is possible to synthesize, out of N independent copies of W, a second set of N binary-input channels $W_N^{(i)}$, $1 \leq i \leq N$ such that as N becomes large, a fraction I(W) of the synthesized channels become near perfect while the remaining fraction of channels become near useless. Codes constructed on the basis of this idea are called polar codes. Non-systematic polar encoders effect polar coding by collecting an input data word d and a fixed word b into a transform input word u and by multiplying it with a transform matrix G to render a codeword x, i.e., x=uG.

The transform matrix G used in polar codes is based on Kronecker products, and its dimension is established as appropriate for the desired channel rate or capacity. Polar coding essentially amounts to selecting some of the elements of the transform input word u to carry the data word d while "freezing" (not using for encoding) the remainder of the elements of the transform input word. The elements of the transform input word that are selected to carry the data word d are those that in effect "see" the relatively good channels created by channel polarization, while the elements of b that are frozen "see" the relatively bad channels. The paper E. Arikan [Arik1], "Channel Polarization: A Method for Constructing Capacity-Achieving Code for Symmetric Binary-Input Memoryless Channels," *IEEE Trans. Inf. Theory*, volume 55, pages 3051-3073 (July 2009), incorporated herein by reference and included in the file history of this application, introduced polar codes and describes how to carry out channel polarization and transmit data reliably in the presence of noise using only the "good" channels. Polar codes have attracted interest for practical applications and several methods have been proposed for improving their performance.

One method that was proposed for enhancing polar coding performance is systematic encoding [Arik2]. Systematic encoding of polar codes has several benefits. First, it improves the Bit Error Rate (BER) performance of polar codes as shown in [Arik2, Li]. Second, it allows construction of "turbo-like" polar codes as pointed out in [Arik2] and studied in detail in [Wu]. Third, systematic encoding of polar codes has also been beneficially applied to develop methods for Hybrid Automatic Repeat request (HARQ) schemes, as in [Feng, Moha]. Recursive methods for carrying out systematic encoding of polar codes in a low-complexity manner have been disclosed in [Arik3]. Specific methods that utilize the recursive principles in [Arik3] for systematic polar encoding appeared in [Chen, Sark1, Sark2, Vang].

Recent work on polar coding within standardization bodies, such as [Huaw1], [Huaw2], [Huaw3], and [Intel], propose certain modifications to polar coding that are not compatible with existing methods of systematic encoding of polar codes. In these works, two major modifications are proposed that are of significance for present purposes. First, a certain amount of redundancy, usually in the form of a cyclic redundancy check (CRC), is inserted into the data so as to improve the performance of a list decoder at the receiver [Tal, Huaw1, Huaw2, Intel]. Second, "puncturing" is applied, as a method adjusting the length and rate of the polar code to desired values [Huaw3, Wang]. These above-described methods of "data-checks" and "puncturing" have been proposed within the framework of non-systematic encoding of polar codes.

As recognized herein, however, data-checks and puncturing as proposed in the cited works distort the structure of polar codes and render existing methods of systematic encoding of polar codes inapplicable.

Present principles critically recognize that a systematic encoder for polar codes that allows insertion of data-checks into the transmitted signal in such a way that there is no concomitant performance penalty relative to the case of non-systematic encoding is desirable in order to maximize channel capacity exploitation, maximize immunity from noise, while exhibiting a low computation complexity to enable it to feasibly operate in expected data transmission environments.

REFERENCES

[Arik1] E. Arikan, "Channel Polarization: A Method for Constructing Capacity-Achieving Codes for Symmetric Binary-Input Memoryless Channels," *IEEE Transactions on Information Theory*, vol. 55, no. 7, pp. 3051-3073, July 2009.

[Arik2] E. Arikan, "Systematic Polar Coding," *IEEE Communications Letters*, vol. 15, no. 8, pp. 860-862, August 2011.

[Arik3] E. Arikan, "Method and system for error correction in transmitting data using low complexity systematic encoder," U.S. Pat. No. 8,347,186 B1, 1 Jan. 2013.

[Chen] G. T. Chen, Z. Zhang, C. Zhong, and L. Zhang, "A Low Complexity Encoding Algorithm for Systematic Polar Codes," *IEEE Communications Letters*, vol. 20, no. 7, pp. 1277-1280, July 2016.

[Feng] B. Feng, Q. Zhang, and J. Jiao, "An Efficient Rateless Scheme Based on the Extendibility of Systematic Polar Codes," *IEEE Access*, vol. PP, no. 99, pp. 1-1, 2017.

[Huaw1] R1-1709995, Polar code construction, Huawei, HiSilicon, 3GPP TSG RAN WG1 NR Ad-Hoc#2, Qingdao, China, 27-30 Jun. 2017

[Huaw2] R1-1709996, Parity check bits for Polar code, Huawei, Hi Silicon, 3GPP TSG RAN WG1 NR Ad-Hoc#2, Qingdao, China, 27-30 Jun. 2017.

[Huaw3] R1-167209, Polar code design and rate matching, Huawei, HiSilicon, 3GPP TSG RAN WG1 Meeting #86, Gothenburg, Sweden, August 22-26, 2016

[Intel] R1-1711347, Simple distributed CRC design for Polar codes, Intel Corporation, 3GPP TSG RAN WG1 Meeting NR-Adhoc#2, Qingdao, P. R. China, 27-30 Jun. 2017.

[Moha] M. S. Mohammadi, I. B. Collings, and Q. Zhang, "Simple Hybrid ARQ Schemes Based on Systematic Polar Codes for IoT Applications," *IEEE Communications Letters*, vol. PP, no. 99, pp. 1-1,2017.

[Sark1] G. Sarkis, P. Giard, A. Vardy, C. Thibeault, and W. J. Gross, "Fast Polar Decoders: Algorithm and Implementation," *IEEE Journal on Selected Areas in Communications*, vol. 32, no. 5, pp. 946-957, May 2014.

[Sark2] G. Sarkis, I. Tal, P. Giard, A. Vardy, C. Thibeault, and W. J. Gross, "Flexible and Low-Complexity Encoding and Decoding of Systematic Polar Codes," *IEEE Transactions on Communications*, vol. 64, no. 7, pp. 2732-2745, July 2016.

[Tal] I. Tal and A. Vardy, "List decoding of polar codes," in 2011 IEEE International Symposium on Information Theory Proceedings (ISIT), 2011, pp. 1-5.

[Vang] H. Vangala, Y. Hong, and E. Viterbo, "Efficient Algorithms for Systematic Polar Encoding," *IEEE Communications Letters*, vol. 20, no. 1, pp. 17-20, January 2016.

[Wang] R. Wang and R. Liu, "A Novel Puncturing Scheme for Polar Codes," *IEEE Communications Letters*, vol. 18, no. 12, pp. 2081-2084, December 2014.

[Wu] D. Wu, A. Liu, Y. Zhang, and Q. Zhang, "Parallel concatenated systematic polar codes," *Electronics Letters*, vol. 52, no. 1, pp. 43-45, Nov. 2015.

The above-listed publications are incorporated herein by reference.

SUMMARY

A systematic polar encoder with data checks includes a data mapper receiving an input data d containing information to be polar coded for transmission and generating a modified data d', together with a nonsystematic polar encoder implementing a transform matrix G that encodes the modified data d' to produce the codeword x such that, for some sub-sequence of coordinates S, $x_S = d$. The non-systematic encoding operation is characterized by a transform input u that includes a part $u_F$ satisfying $u_F = b$ for a fixed word b that is independent of the data word d, a part $u_T = t$ for an inverse puncture word t that is a fixed word independent of the data word d, a part $u_I$ carrying the modified data, $u_I = d'$, and a part $u_C$ carrying a check word derived from the modified data, $u_C = f(d')$, by a check generator function f, the part $u_C$ being strictly non-null. Corresponding to the transform input u is a transform output z given by $z = uG$ that includes a punctured part $z_P$ satisfying $z_P = p$ for a puncture word p that is a fixed word independent of the data word d, a part $z_J$ carrying the data d, $z_J = d$, and a part $z_R$ serving as redundant symbols, wherein the codeword x is related to the transform output by $x = z_Q$ where $Q = (J, R)$ is the complement of the punctured part P. The transform matrix G, the input partition (F, C, I, T) and the output partition (P, J, R) are selected such that $G_{I,P} = 0$, $G_{C,P} = 0$, $G_{F,P} = 0$, and $G_{T,P}$ is invertible and preferably selected such that the check generator function f is an affine function, $G_{I,J}$ is invertible, $G_{C,J} = 0$, and $G_{F,J} = 0$.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware together with either or both of software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A; B; C; A and B; A and C; B and C; and A, B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this disclosure. Those of ordinary skill in the art should understand that in many if not most instances such definitions apply to prior as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 8 illustrates an example wireless network within which error correction using a low complexity systematic encoder in data transmission may be implemented according to this disclosure;

DETAILED DESCRIPTION

Figure 1:
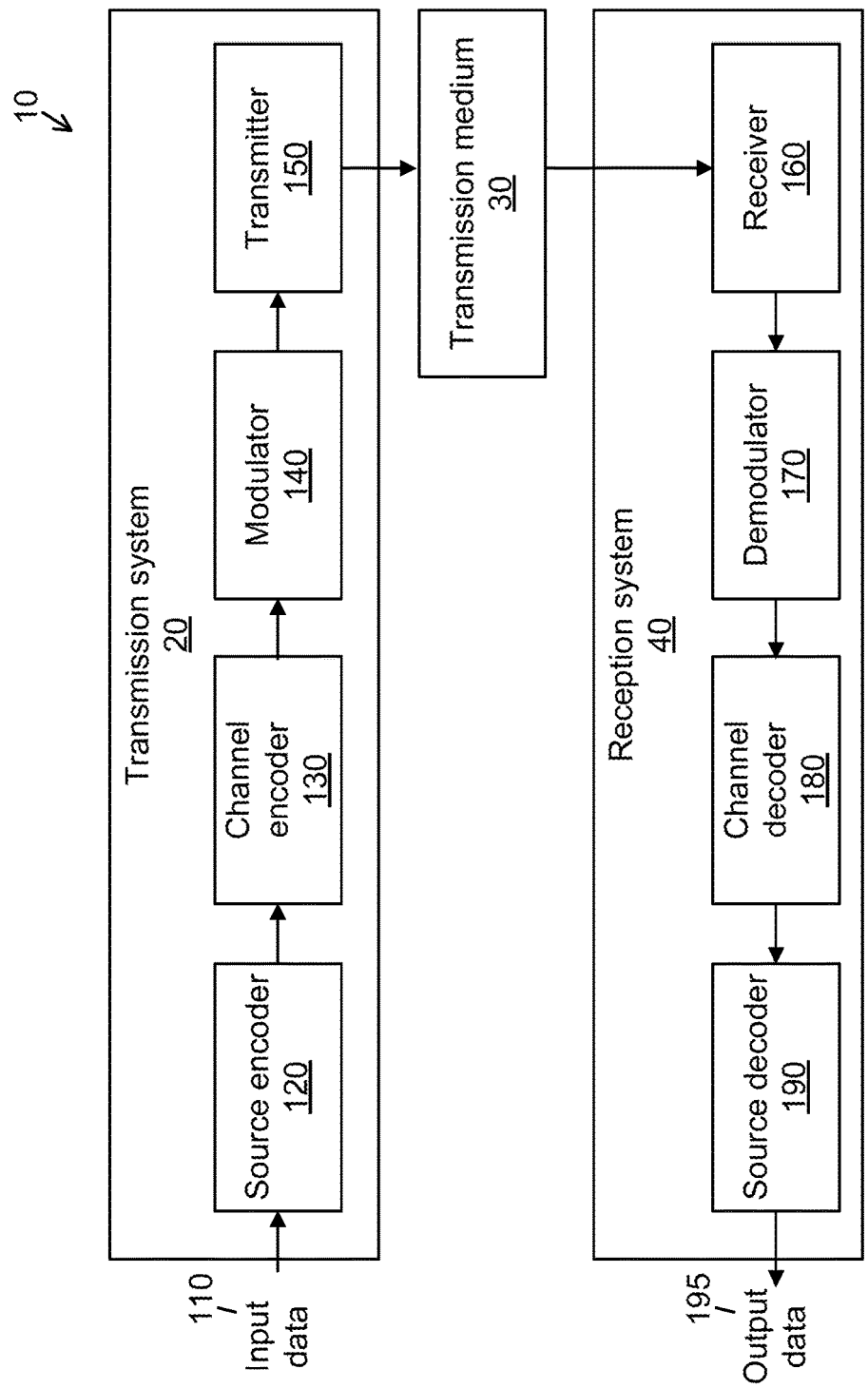
FIG. 1 depicts a communication system in which embodiments of error correction using a low complexity systematic encoder in data transmission according to embodiments of the present disclosure.

FIGS. 1 through 9B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system.

In accordance with established conventions in coding theory, data words, parity words, and codewords in the system are represented herein as vectors over a finite field $F_q$ where q denotes the number of elements in the field. Field elements (scalars) are denoted by plain lower case letters, such as $a \in F_q$. Vectors over a field are denoted by lower-case boldface letters, such as $a \in F_q^N$, where N denotes the length of the vector. The notation $a_i$ denotes the ith coordinate of a vector a. The convention that the elements of a vector of length N are indexed with integers $0, 1, \ldots, N-1$ is used. Thus, a vector $a \in F_q^N$ is denoted in terms of its elements as $(a_0, \ldots, a_{N-1})$ or alternatively as $(a_i: 0 \le i \le N-1)$. Matrices over a field are denoted by upper-case boldface letters, such as $A \in F_q^{M \times N}$, where M denotes the number of rows and N denotes the number of columns of A. The notation $a_{i,j}$ denotes the element in the ith row and jth column of A. The elements of a matrix with M rows and N columns are indexed with a pair of integers (i,j), $0 \le i \le M-1$, $0 \le j \le N-1$. Accordingly, a matrix $A \in F_q^{M \times N}$ is denoted in terms of its elements as $(a_{i,j}: 0 \le i \le M-1, 0 \le j \le N-1)$. The size of a matrix A is defined as the number of elements in A; thus, the size of a matrix with M rows and N columns is MN. All-zero vectors and all-zero matrices are denoted by 0.

Often sub-vectors of a given vector or sub-matrices of a given matrix are considered. To specify such sub-vectors or sub-matrices, tuples (ordered lists of distinct indices over a given index set) are used, and denoted by italic upper-case letters such as I, J. The number of elements in a tuple I is denoted by |I|.

For example, if $a=(a_0, a_1, a_2, a_3)$ and I=(1,3), then $a_I=(a_1, a_3)$; whereas, if I=(3,1), then $a_I=(a_3, a_1)$. A similar notation applies to matrices and their sub-matrices. For example, if $$A = \begin{bmatrix} a_{0,0} & a_{0,1} & a_{0,2} & a_{0,3} \\ a_{1,0} & a_{1,1} & a_{1,2} & a_{1,3} \\ a_{2,0} & a_{2,1} & a_{2,2} & a_{2,3} \\ a_{3,0} & a_{3,1} & a_{3,2} & a_{3,3} \end{bmatrix},$$

I=(1,3), and J=(2,0,3), then $$A_{I,J} = \begin{bmatrix} a_{1,2} & a_{1,0} & a_{1,3} \\ a_{3,2} & a_{3,0} & a_{3,3} \end{bmatrix}.$$

In general, for a vector $a=(a_0, a_1, a_2, \ldots, a_{N-1})$ and a k-tuple $I=(i_1, i_2, \ldots, i_k)$ of indices over $\{0, 1, \ldots, N-1\}$, $a_I$ denotes the sub-vector $(a_{i_1}, a_{i_2}, \ldots, a_{i_k})$. Likewise, for a matrix $$A = \begin{bmatrix} a_{0,0} & a_{0,1} & \cdots & a_{0,N-1} \\ a_{1,0} & a_{1,1} & \cdots & a_{1,N-1} \\ \vdots & \vdots & \ddots & \vdots \\ a_{M-1,0} & a_{M-1,1} & \cdots & a_{M-1,N-1} \end{bmatrix}$$

with M rows and N columns, an m-tuple $I=(i_1, i_2, \ldots, i_m)$ over $\{0, 1, \ldots, M-1\}$, and an n-tuple $J=(j_1, j_2, \ldots, j_n)$ over $\{0, 1, \ldots, N-1\}$, the notation $A_{I,J}$ denotes the sub-matrix $$A_{I,J} = \begin{bmatrix} a_{i_1, j_1} & a_{i_1, j_2} & \cdots & a_{i_1, j_n} \\ a_{i_2, j_1} & a_{i_2, j_2} & \cdots & a_{i_2, j_n} \\ \vdots & \vdots & \ddots & \vdots \\ a_{i_m, j_1} & a_{i_m, j_2} & \cdots & a_{i_m, j_n} \end{bmatrix}.$$

A tuple of tuples $(I_1, I_2, \ldots, I_n)$ is called a partition of the index set $\{0, 1, \ldots N-1\}$ if each index $0 \le i \le N-1$ belongs to one and only one of the tuples $I_j$, and each element of each tuple belongs to the index set $\{0, 1, \ldots, N-1\}$. Every partition $(I_1, I_2, \ldots, I_n)$ of $\{0, 1, \ldots, N-1\}$ partitions each vector $a=(a_0, a_1, a_2, \ldots, a_{N-1})$ into n (disjoint) sub-vectors $a_{I_i}$, $1 \le i \le n$. Likewise, every pair of partitions $(I_1, I_2, \ldots, I_m)$ of $\{0, 1, \ldots, M-1\}$ and $(J_1, J_2, \ldots, J_n)$ of $\{0, 1, \ldots, N-1\}$ partitions each matrix A with row index set $\{0, 1, \ldots, M-1\}$ and column index set $\{0, 1, \ldots, N-1\}$ into m×n (disjoint) sub-matrices $A_{I_i, J_j}$, $1 \le i \le m$, $1 \le j \le n$.

The product of a row vector $a \in F_q^M$ and a matrix $A \in F_q^{M \times N}$ is denoted as aA. The Kronecker product of two matrices $A \in F_q^{m \times r}$ and $B \in F_q^{k \times l}$ is defined as:

$$A \otimes B = \begin{bmatrix} a_{0,0}B & a_{0,1}B & \ldots & a_{0,r-1}B \\ a_{1,0}B & a_{1,1}B & \ldots & a_{1,r-1}B \\ \vdots & \vdots & \ddots & \vdots \\ a_{m-1,0}B & a_{m-1,1}B & \ldots & a_{m-1,r-1}B \end{bmatrix},$$

which is an mk-by-rl matrix. A matrix C is said to factorize into a Kronecker product of a matrix A and B if $C=A \otimes B$. The nth Kronecker power of a matrix A is defined recursively as $A^{\otimes n} = A \otimes A^{\otimes(n-1)}$ for $n \ge 2$, with $A^{\otimes 1} = A$.

Encoding operations comprise various transformations of vector representations of data words, parity words, and codewords. The term "transform" is used below to refer to linear vector space transformations. Transforms are represented by matrices. Transforms are usually cited below together with a specific matrix representation; for example, "transform G" refers to a transform that is represented by the matrix G in a specific basis.

For an integer i in the range $0 \le i \le 2^n - 1$, $b_{n-1} b_{n-2} \ldots b_0$ is the binary expansion of i if $b_m$ is 0 or 1 for each $0 \le m \le n-1$ and $$i = \sum_{m=0}^{n-1} b_m 2^m.$$

For any two integers i,j in the range $0 \le i, j \le 2^n - 1$, the notation $i \succ j$ is used to indicate that the binary expansion $b_{n-1} b_{n-2} \ldots b_0$ of i dominates the binary expansion $b'_{n-1} b'_{n-2} \ldots b'_0$ of j in the sense that $b_m \ge b'_m$ for all $0 \le m \le n-1$. The notation "$i \succ j$" and the phrase "i dominates j" are used synonymously. The relation "$\succ$" on the set of integers in the range 0 to $2^n - 1$ defines a "partial order." It is reflexive: $i \succ i$ for every i; antisymmetric: if $i \succ j$ for distinct i and j, then the converse $j \succ i$ cannot be true; and transitive: if $i \succ j$ and $j \succ k$, then $i \succ k$. The relation "$\succ$" is a "partial order" (as opposed to a "total order") in the sense that there are integers i and j for which neither $i \succ j$ nor $j \succ i$ is true. For example, neither 14 (which is 1110 in binary) nor 7 (which is 0111 in binary) dominates the other.

A special type of transform that is important for polar coding is the transform $F^{\otimes n}$ where $$F = \begin{bmatrix} 1 & 0 \\ 1 & 1 \end{bmatrix}$$

and $F^{\otimes n}$ is the nth Kronecker power of F. A well-known [Arik1] property links $F^{\otimes n}$ with the domination relation between binary expansions: we have $(F^{\otimes n})_{i,j} = 1$ if and only if $i \succ j$, where the rows and columns are indexed starting with 0 and the indices take values in the range $0 \le i, j \le 2^n - 1$. For example, with n=3, we have $$F^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix};$$

and $(F^{\otimes 3})_{6,5} = 0$ since $6 \succ 5$ is false, while $(F^{\otimes 3})_{7,j} = 1$ since $7 \succ j$ for all $0 \le j \le 7$.

A key property of the transform $F^{\otimes n}$ that is important for present principles is that for any tuple of k (distinct) coordinates, such as $A = (a_1, a_2, \ldots, a_k)$, the submatrix $(F^{\otimes n})_{A,A}$ is invertible. This can be seen by observing that if the elements of A are in ascending order, $a_1 < a_2 < \ldots < a_k$, then A is lower triangular with 1 s on the diagonal. If A is not in ascending order, one may consider the tuple $\overline{A}$ that has the coordinates in A in the ascending order. Since $(F^{\otimes n})_{A,A}$ and $(F^{\otimes n})_{\overline{A},\overline{A}}$ differ only by a permutation of rows and columns, one is invertible if and only if the other is invertible.

A second key property of the transform $F^{\otimes n}$ is that, for any two tuples $A = (a_1, a_2, \ldots, a_k)$ and $B = (b_1, b_2, \ldots, b_m)$, the submatrix $(F^{\otimes n})_{A,B}$ equals the all-zero matrix if and only if no element $a_i$ of A dominates any element $b_j$ of B; that is, $(F^{\otimes n})_{A,B} = 0$ if and only if $a_i \succ b_j$ is false for every $1 \le i \le k$ and $1 \le j \le m$.

With the above in mind, initially referring to FIG. 1, a communication system 10 is shown in which embodiments of an error correction system using a low complexity systematic encoder in transmitting data according to embodiments of the present disclosure may be used. As shown, the communication system 10 includes a transmission system 20, which receives input data, encodes and modulates the received data, and transmits the encoded and modulated data into a transmission medium 30. Further, the system 10 includes a reception system 40, which receives, demodulates and decodes the data that is received from the transmission medium 30.

It is to be understood that present principles apply to various transmission systems and media. For example, in a wireless communication system, the transmission medium 30 typically is space or the atmosphere, in which case the communication system 10 is a wireless communication system. In such embodiments, the transmission system 20 and reception system 40 each include antenna(s) coupled respectively to the transmitter 150 and receiver 160. However, other embodiments of the present disclosure may be implemented in wired communications systems, in which case the transmission medium 30 may be a cable or a wire that connects the transmission system 20 to the reception system 40. Embodiments of the present disclosure may also be implemented for storage systems, in which case the transmission medium 30 may be a magnetic tape, a hard disk drive, an optical disk drive, a solid state memory, or another storage medium.

As will be apparent to those of skill in the art, input data 110 is ordinarily input into the transmission system 20 for eventual transmission to the reception system 40. A source encoder 120 compresses input data 110 so that the amount of data that must be transmitted is reduced. Data output from the source encoder 120 is then encoded by a channel encoder 130, which is configured as described in further detail below. Such encoding renders the data to be transmitted more robust against errors that may be introduced during transmission across the transmission medium 30. In accordance with present principles, the channel encoder 130 implements a systematic encoder. After such encoding, the data is modulated by a modulator 140 and provided to a transmitter 150 for transmission through the transmission medium 30 to the reception system 40. The transmitter 150 has the task of converting information into signals capable of being transmitted across the transmission medium 30. For example, the transmitter 150 may be a radio frequency (RF) radio transmitter with an antenna when the transmission medium 30 is airwaves or the transmitter 150 may be a laser device sending light into a fiber-optic cable.

The reception system 40 generally receives signals from the transmission medium 30 and demodulates and decodes them to extract the output data 195. With more specificity, a receiver 160 of the reception system 40 receives signals from the transmission system 20 and passes the signals to a demodulator 170, which demodulates the received signals. The demodulated signals are then sent to a channel decoder 180, which produces a decoded data as an estimate of the transmitted data, and then the decoded data is sent to a source decoder 190 to decompress (and optionally verify) the data. It will readily be appreciated that the demodulator 170, channel decoder 180, and source decoder 190 perform the inverse of the operations performed by the modulator 140, channel encoder 130, and source encoder 120, respectively, subject to limitations imposed by noise effects and other non-idealities in the system. In any case, if the communication system 10 is properly designed and operated within its design parameters, extracted output data 195 should match the input data 110 with high reliability.

According to present principles, each component 120, 130, 140, and 150 of the transmission system 20 and each component 160, 170, 180, and 190 of the reception system 40 comprises electrical circuits and may be implemented on its own respective semiconductor chip, with the various chips communicating with each other according to the system of FIG. 1. Alternatively, one semiconductor chip may bear all or multiple components of the transmission system, and a second semiconductor chip may bear all or multiple components of the reception system. Such chips may implement a circuit of logic gates such as those described herein. Yet again, a processor such as a digital signal processor (DSP) comprising electrical circuits and accessing logic implemented in hardware (optionally programmed by software or firmware) may execute the function(s) of one or more of the components of each of the transmission system 20 and (on a separate processor) the reception system 40. If software forms part of the implementation of the processor(s) (in addition to hardware in the form of digital logic and analog signal processing electrical circuits), the software is stored on a computer readable storage medium such as but not limited to disk-based or solid state storage such that a machine such as a DSP executes method steps according to the logic. In any case, when the channel encoder 130 is implemented on a semiconductor chip, the circuitry of the chip establishes a coding circuit which defines a systematic encoder in accordance with description herein. Similarly, when the channel encoder 130 is implemented by a processor accessing hardware-embodied logic (or, optionally, software-embodied logic programming of hardware logic), the processor with logic establishes a circuit which defines a systematic encoder in accordance with description herein. A combination of the above implementations may be used.

Figure 2:
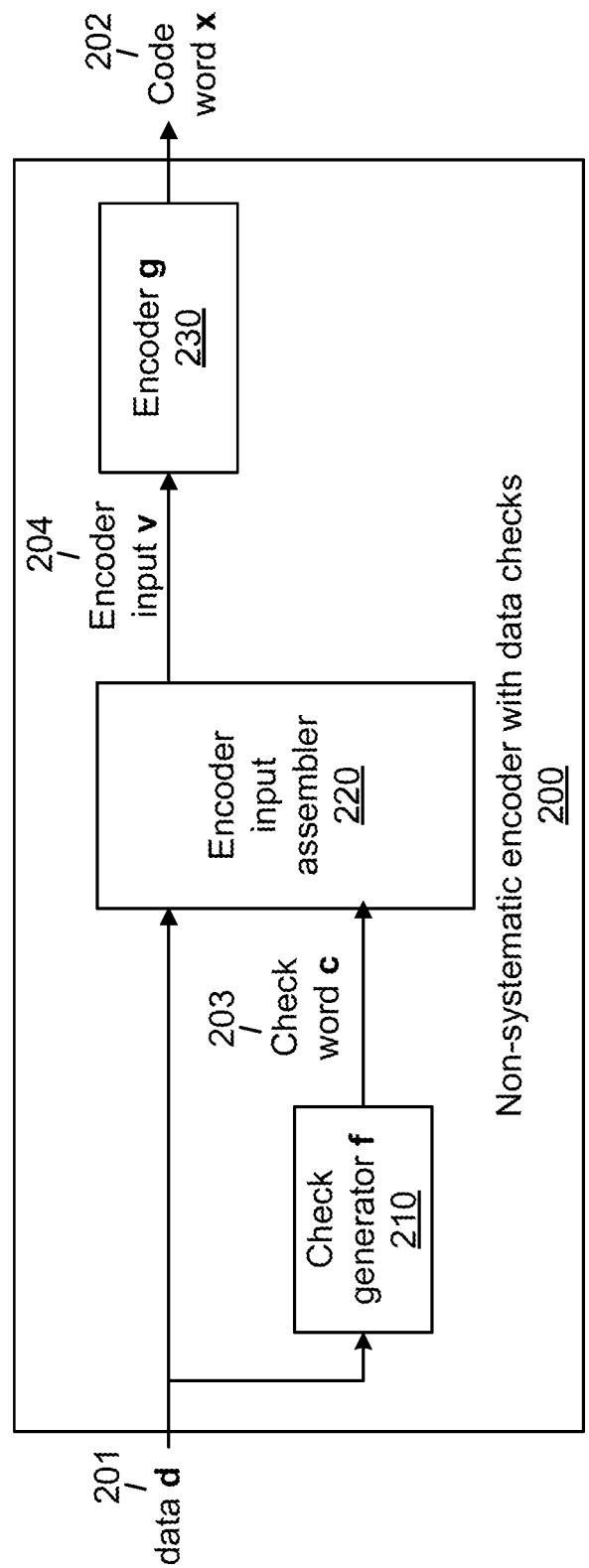
FIG. 2 is a simplified diagram of a non-systematic encoder with data checks that may be employed within embodiment of the present disclosure.

Turning to FIG. 2, a simplified diagram of a non-systematic encoder with data checks 200 is shown which receives a data (or, equivalently, "data word") d 201 and converts it to a codeword x 202. The non-systematic encoder with data checks 200 includes a redundancy (or "check") generator f 210 which takes the data d as input and generates a check word c 203 as output, the check word c 203 having the form of a non-null sequence of symbols computed as a function c=f(d) of the data d, which provides extra redundancy that a decoder at the receiver can utilize to make more reliable decisions. An encoder input assembler 220 combines the data d 201 and the check word c 203 into an encoder input v 204. An encoder 230 receives the encoder input v 204 and generates the codeword x 202. The encoder 230 implements a function g such that the encoder input v 204 (and therefore data d 201 and check word c 203) satisfy a predetermined functional (e.g., arithmetic or logical) relationship with the codeword x 202. The non-systematic encoder with data checks 200 is non-systematic in the sense that the data d 201 is not guaranteed to appear transparently as part of the codeword x 202. In some applications, parts of the codeword x 202 may be "punctured"—or, in other words, may not be sent to the channel. Puncturing primarily aims to adjust the length of the codeword to a specified value. Present principles apply not only in the presence of data checks that incorporate a check word 203 but also when puncturing is applied.

Figure 3:
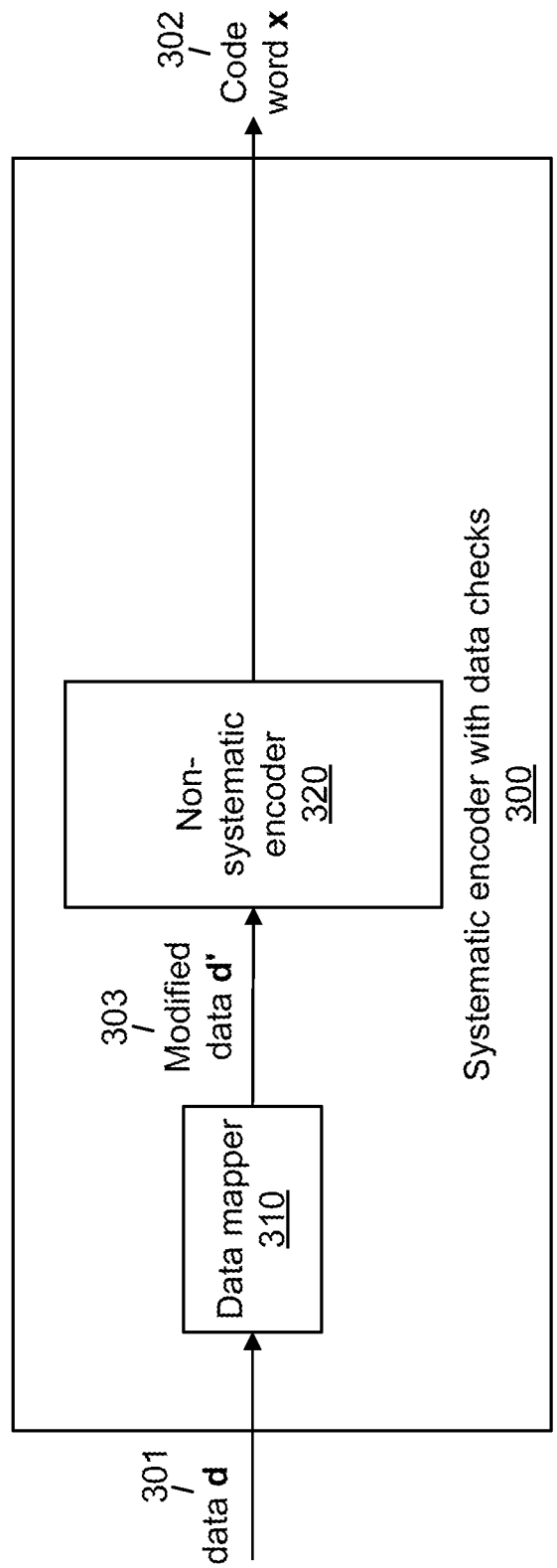
FIG. 3 is a simplified diagram of a systematic encoder with data checks that may be employed within embodiment of the present disclosure.

Turning to FIG. 3, a systematic encoder with data checks 300 is a systematic version of the non-systematic encoder with data checks 200 in FIG. 2. The systematic encoder with data checks 300 receives a data d 301 and converts it to a codeword x 302. The codeword x 302 is a sequence of symbols and contains the data d 301 transparently in the sense that, for some sub-sequence of coordinates S, $x_S=d$. The systematic encoder with data checks 300 includes a data mapper 310 and a non-systematic encoder with data checks 320. The data mapper 310 is a mapper that maps the data d 301 to a modified data d' 303. The modified data d' 303 is received by a non-systematic encoder with data checks 320, which is a non-systematic encoder 200 of the type shown in FIG. 2. The non-systematic encoder 320 processes the modified data d' 303 and produces the codeword x 302.

One problem addressed by the present disclosure is the construction of a data mapper that turns a non-systematic encoder with data checks into a systematic encoder with data checks. It is to be noted that a direct implementation of such a data mapper may be prohibitively complex due to the inclusion of redundancy as part of the encoding process. Present principles described herein address the development of a low-complexity method for implementing such a data mapper for the case of polar codes, which is the primary application domain for subject matter of the present disclosure.

Figure 4:
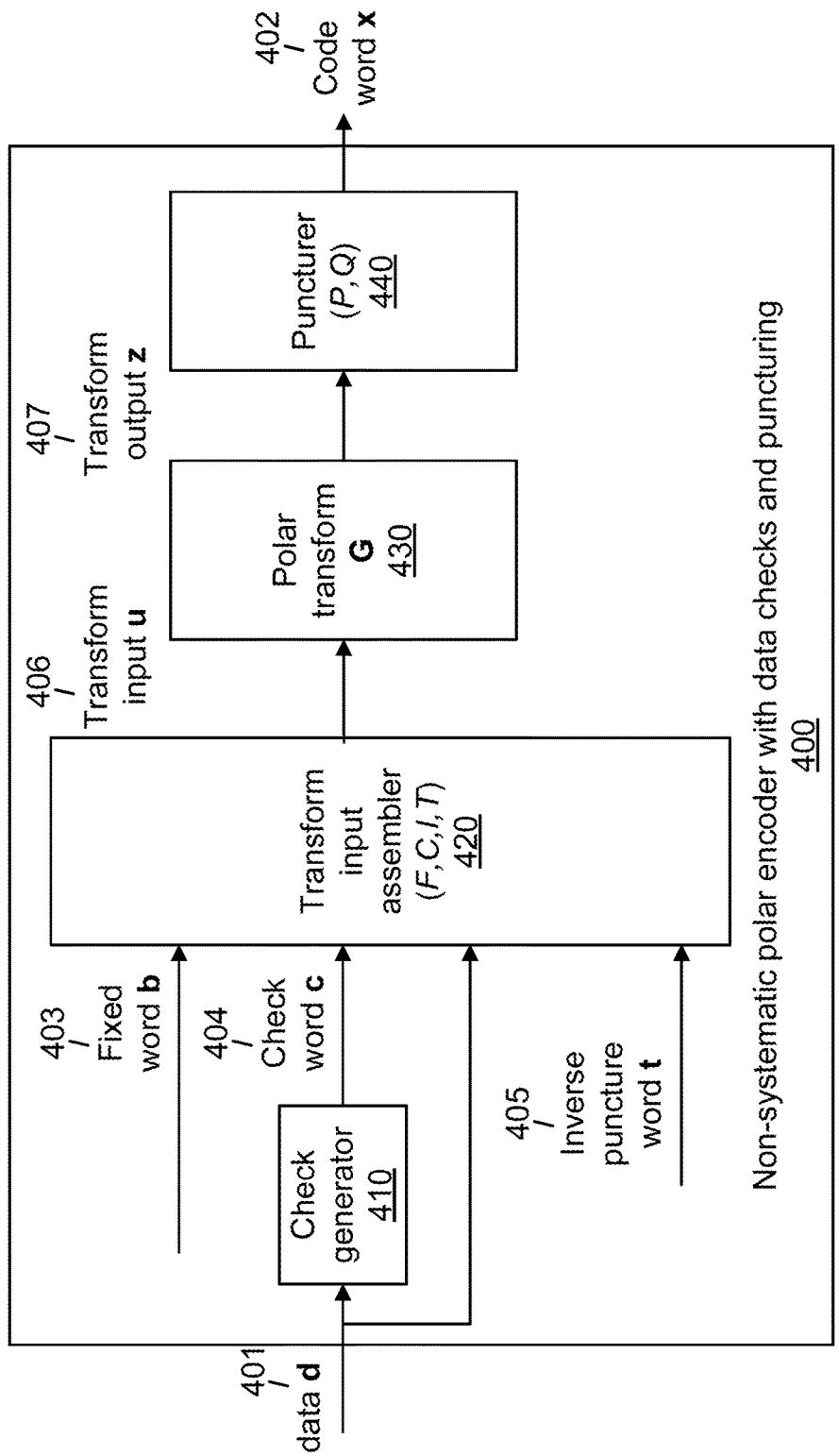
FIG. 4 depicts a non-systematic polar encoder according to embodiments of the present disclosure.

FIG. 4 shows a non-systematic polar encoder 400 which is a polar encoder comprising data checks and puncturing according to embodiments of the present disclosure. The non-systematic polar encoder 400 is a special instance of the non-systematic encoder 200 of FIG. 2, specified in greater detail for the special case of polar codes.

The non-systematic polar encoder 400 includes as processing blocks a check generator 410, a transform input assembler 420, a polar transform G 430, and a puncturer 440. Those processing blocks operate on a number of sequences of symbols (signals), including a data d 401, a codeword x 402, a fixed word b 403, a check word c 404, and an inverse puncture word t 405.

The non-systematic polar encoder 400 receives, as input, a data d 401 and produces, as output, a codeword x 402.

The fixed word b 403 is a fixed pattern of symbols independent of the data d 401.

The check generator 410 computes a check word c 404 from the data d 401 by computing c=f(d), where f is a function independent of the data d 401.

The inverse puncture word t 405 is a fixed pattern of symbols independent of the data d 401.

The transform input assembler 420 receives the data d 401, the fixed word b 403, the check word c 404, and the inverse puncture word t 405, and produces the transform input u 406. The multiplexing operation by the transform input assembler 420 is characterized by an input partition (F, C, I, T), which is a partition of the index set $\{0, 1, \ldots, N-1\}$ of the input vectors of the polar transform G 430. The transform input assembler 420 assembles the transform input u 406 in accordance with the partition (F, C, I, T) so that $u_F$=b, $u_C$=c, $u_I$=d, and $U_T$=t.

The polar transform G 430 implements a transform operation represented by a "polar transform matrix G," where in the most general form of the present principles G is an arbitrary invertible matrix with N rows and N columns, for some positive integer N. However, present principles are applicable at low complexity only if G has a special structure, as described below.

It is to be noted that the present disclosure uses the convention of labeling the rows and columns of the transform matrix G by the integers $\{0, 1, \ldots, N-1\}$ solely for convenience of notation in the presentation of present principles. It will be clear that alternative labeling conventions may be used in actual embodiments of present principles.

In preferred embodiments of present disclosure, the polar transform matrix G 430 is given by the Kronecker product of a plurality of matrices, each of which has a size smaller than a size of G, so as to render computation of the transform at low-complexity possible by using recursive computational methods.

Preferred embodiments are applicable with advantage whenever the transform matrix has the form $G=A(F_1 \otimes G_1) B^T$, wherein A is a permutation matrix, $F_1$ is a first kernel transform, $G_1$ is a first-tier transform, B is a permutation matrix, the first kernel transform $F_1$ has a size greater than one, and the first-tier transform $G_1$ has a size smaller than a size of the transform G. A common choice for the preferred embodiments of present principles is to take A and B as the identity permutation.

In a first type of a most preferred embodiment of present principles, the transform matrix has the form $G=F^{\otimes n}$, where $$F = \begin{bmatrix} 1 & 0 \\ 1 & 1 \end{bmatrix}$$

and all transform operations are carried out in the binary field $F_2$. In this case, the number of rows and columns is constrained to be a power of two, $N=2^n$. (The need for puncturing arises in order to set the length of the codewords to integer values other than powers of two. The present disclosure describes how to carry out specific methods of puncturing in combination with systematic encoding of data.)

In a second type of most preferred embodiment of present principles, the transform matrix has the form $G=AF^{\otimes n}B^T$, where A or B is a "bit reversal" permutation, as defined in [Arik1].

The polar transform G 430 takes as input the transform input u 406 and produces a transform output z 407, the transform output z 407 being related to the transform input u 406 by the functional relationship z=uG. The transform output z 407 is processed by a puncturer 440, the puncturer 440 being characterized by an output partition (P, Q), the output partition (P, Q) being a partition of the index set $\{0, 1, \ldots, N-1\}$ of vectors in the range space of the polar transform G 430.

The codeword x 402 is obtained from the transform output z 407 by setting $x=z_Q$, which corresponds to puncturing the part $z_P$.

In some forms of puncturing, such as in [Wang, Huaw3], and in preferred embodiments of present principles, the puncturing operation includes a constraint of the form $z_P$=p, where p is a fixed word independent of the data d 401. The non-systematic encoder 400 accommodates such a constraint by computing the inverse puncture word t 405 as a function of p and substituting the constraint $U_T$=t in place of $z_P$=p.

Figure 5:
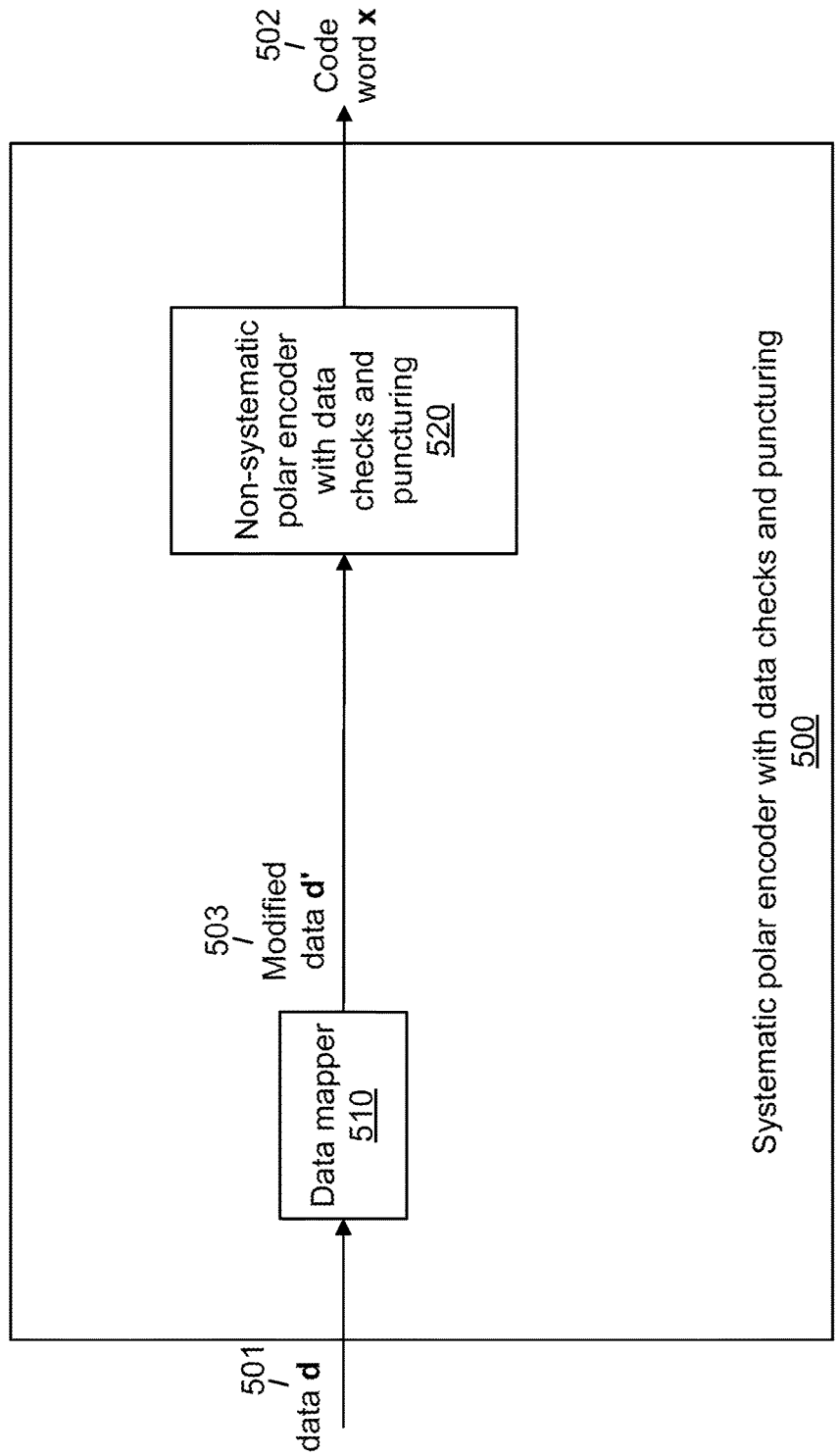
FIG. 5 depicts a systematic polar encoder with data checks according to embodiments of the present disclosure.

Turning to FIG. 5, a systematic polar encoder with data checks and puncturing 500 is depicted. The systematic polar encoder 500 is a systematic polar encoder of the type in FIG. 3 customized for polar coding and that can be configured to turn a non-systematic polar encoder of the type in FIG. 4 into a systematic polar encoder.

The systematic polar encoder 500 includes a data mapper 510 and a non-systematic polar encoder with data checks and puncturing 520. The non-systematic polar encoder 520 is a non-systematic polar encoder such as the non-systematic polar encoder with data checks and puncturing 400 in FIG. 4.

The data mapper 510 receives a data d 501 and converts it into a modified data d' 503, which in turn is received as input by the non-systematic polar encoder 520 and encoded into a codeword x 502. The systematic polar encoder 500 is systematic in the sense that there is a fixed tuple S such that $x_S$=d.

Embodiments of present principles described below aim to turn a given non-systematic polar encoder 520 into a systematic polar encoder as in FIG. 5 by building a suitable data mapper 510, without changing the structure of the non-systematic encoder 520.

Before presenting specific embodiments of present rules, the underlying principles will be explained by carrying out a mathematical analysis of the relationship between the data mapper 510 and the non-systematic encoder 520. This analysis will reveal sufficient conditions to render practical implementations of the systematic polar encoder 500 possible.

In the analysis of the systematic polar encoder 500 that follows, it will be assumed that the non-systematic polar encoder 520 is a non-systematic polar encoder 400 of the type shown in FIG. 4 and that the notation of FIG. 4 will be used throughout the analysis. In FIG. 4, the puncturer uses a partition (P, Q); in the analysis, this partition will be refined into a partition (P, J, R) by splitting the tuple Q into two (disjoint) tuples J and R.

Turning to the analysis, note that the encoding operation is carried out under the following constraints. First, there is the transform relationship:

$$z=uG \qquad (1)$$

Second, the transform input is assembled from its various parts as $$u_T=t \qquad (2)$$

$$u_I=d' \qquad (3)$$

$$u_C = c = f(d) \quad (4)$$

$$u_F = b \quad (5)$$

Third, there is the systematic encoding constraint that the data appear as part of the transform output:

$$z_J = d \quad (6)$$

Finally, preferred embodiments of present principles impose a constraint of the form $$z_P = p \quad (7)$$

on the puncturing operation, where p is a fixed pattern independent of the data d. The system of Eq. (1) through (7) constitute an overdetermined system in the sense that there are more equations than the number of degrees of freedom, which is equal to N. However, in preferred embodiments of present principles, Eq. (2) and (7) actually stand for the same constraint by allowing t to be a function of p. Hence, it is possible to satisfy Eq. (1) through (7) simultaneously, provided that the partitions (F, C, I, T) and (P, J, R) are selected properly. The present disclosure describes methods of selecting the partitions that render systematic encoding under the constraints of Eq. (1) through (7) feasible.

To discuss present principles more thoroughly, it is useful to rewrite the transform relation Eq. (1) in the following form:

$$z_P = u_T G_{T,P} + u_I G_{I,P} + u_C G_{C,P} + u_F G_{F,P} \quad (8)$$

$$z_J = u_T G_{T,J} + u_I G_{I,J} + u_C G_{C,J} + u_F G_{F,J} \quad (9)$$

$$z_R = u_T G_{T,R} + u_I G_{I,R} + u_C G_{C,R} + u_F G_{F,R} \quad (10)$$

Eq (8)-(10) reveal the effect of each part of the transform input on each part of the transform output under the input and output partitions (F, C, I, T) and (P, J, R). A number of design rules emerge by inspecting Eq. (2) through (10), as stated below. These design rules form the mathematical basis of present principles.

Design Rule 0:

Choose the transform matrix G and the input partition (F, C, I, T) and the output partition (P, J, R) so that $G_{I,P}=0$, $G_{C,P}=0$, $G_{F,P}=0$, and $G_{T,P}$ is invertible.

Remark:

Design Rule 0 ensures that p and t stand in one-to-one relationship to each other by the relations $p = tG_{T,P}$ and $t = p(G_{T,P})^{-1}$, as can be seen readily from Eq. (2), (7), and (8).

Design Rule 1:

Choose the transform matrix G, the input partition (F, C, I, T), and the output partition (P, J, R) so that, in addition to Design Rule 0 being satisfied, the check generator Eq. (4) is an affine function of the form $$u_C = u_I E + e, \quad (11)$$

and $(G_{I,J} + EG_{C,J})$ is an invertible matrix.

Remark:

Under Design Rule 1, it follows from Eq. (2) through (7) and Eq. (9) that $$d' = (d - tG_{T,J} - eG_{C,J} - bG_{F,J})(G_{I,J} + EG_{C,J})^{-1} \quad (12)$$

Eq. (12) defines a data mapper that can be used in the role of the data mapper 510 in FIG. 5. This possibility is explored below as a first embodiment of present principles.

A First Embodiment of the Systematic Polar Encoder 500.

The first embodiment assumes that Design Rule 1 is satisfied. The data mapper 510 in this embodiment is based on Eq. (12), which can be written in a simpler form as $$d' = dD + a \quad (13)$$

where $D = (G_{I,J} + EG_{C,J})^{-1}$ and $a = (-tG_{T,J} - eG_{C,J} - bG_{F,J})(G_{I,J} + EG_{C,J})^{-1}$. The matrix D and the vector a are independent of the data d, so they can be precomputed and the data mapping operation Eq. (13) consists of computing an affine transform of the data d.

In this embodiment, after obtaining the modified data d' 503 by Eq. (13), systematic polar encoding can be completed by employing any available non-systematic encoder in place of the non-systematic encoder 520. If a non-systematic encoder is not available, or as an alternative to an existing non-systematic encoder, the non-systematic encoder 520 can be realized by assembling the transform input u 406 in accordance with Eq. (2) through (5), and computing the transform output z 407 in accordance with Eq. (1). Once the transform output z 407 is available, the codeword x 402 is obtained by setting $x = z_Q$ where $Q = (J, R)$ is the complement of the punctured indices P.

The first embodiment mainly serves a proof-of-concept purpose by showing that a data mapper can be implemented by computing Eq. (13). For practical applications, the first embodiment may be too complex since the matrix D that appears in Eq. (13) may not have any structure that can be exploited for reducing complexity of computations. A direct computation of dD has a computational complexity on the order of the size of matrices involved, which for a code of length N may run into order $N^2$. In refinements of the first embodiment, further structure is imposed on the transform matrix G to bring down computational complexity to practical levels.

Design Rule 2:

The transform matrix G, the input partition (F, C, I, T), and the output partition (P, J, R) are chosen so that, in addition to Design Rule 0 being satisfied, $G_{I,J}$ is invertible, $G_{C,J}=0$, and $G_{F,J}=0$.

Remark:

Under Design Rule 2, Eq. (13) simplifies to $$d' = d(G_{I,J})^{-1} - tG_{T,J}(G_{I,J})^{-1}. \quad (14)$$

Eq. (14) defines an alternative data mapper that will be explored in a second embodiment of present principles.

A Second Embodiment of Systematic Polar Encoder 500.

The second embodiment assumes that the system under discussion conforms to Design Rule 2. This embodiment uses a data mapper based on Eq. (14). The rest of the systematic encoding operation can be completed in the same manner as in the first embodiment.

A direct computation of Eq. (14) may still be too complex for practical purposes. A third embodiment of present principles below organizes the computations in the second embodiment in a different manner with the goal of taking advantage of a structure that may exist in the transform G, which proves useful when working directly with the matrix $(G_{I,J})^{-1}$ as in Eq. (14) does not allow taking advantage of such structure readily.

A Third Embodiment of Systematic Polar Encoder 500.

The third embodiment refines the computational method of the second embodiment and constitutes a most preferred embodiment of present principles.

Consider the matrix $$\tilde{G} = \begin{bmatrix} G_{T,P} & G_{T,J} & G_{T,R} \\ G_{I,P} & G_{I,J} & G_{I,R} \\ G_{C,P} & G_{C,J} & G_{C,R} \\ G_{F,P} & G_{F,J} & G_{F,R} \end{bmatrix} \quad (15)$$

The matrix $\tilde{G}$ is obtained by permuting the rows and columns of G:

$$\tilde{G}=AGB^T \quad (16)$$

where A and B are permutation matrices. Assuming that G is invertible, $\tilde{G}$ is also invertible and $$(\tilde{G})^{-1}=BG^{-1}A^T, \quad (17)$$

as can be verified by direct computation and noting that the inverse of a permutation matrix equals its transpose.

Under Design Rule 2, the matrix $\tilde{G}$ has an upper triangular form $$\tilde{G} = \begin{bmatrix} G_{T,P} & G_{T,J} & G_{T,R} \\ 0 & G_{I,J} & G_{I,R} \\ 0 & 0 & G_{C,R} \\ 0 & 0 & G_{F,R} \end{bmatrix}. \quad (18)$$

It is well known that an invertible upper-triangular matrix has an inverse which is also upper-triangular. Thus, the inverse of $\tilde{G}$ has the form $$(\tilde{G})^{-1} = \begin{bmatrix} (G_{T,P})^{-1} & -(G_{T,P})^{-1}G_{T,J}(G_{I,J})^{-1} & * & * \\ 0 & (G_{I,J})^{-1} & * & * \\ 0 & 0 & * & * \end{bmatrix} \quad (19)$$

where "*" denotes a generic submatrix whose particular form does not have any significance for present purposes. Note that Eq. (19) assumes that the inverses of $G_{T,P}$ and $G_{I,J}$ exist, which is guaranteed to be true by Design Rule 2.

A third embodiment comprises the following data mapper. A preferred embodiment of the data mapper 510 will:
1) Receive as input the data d 501;
2) Prepare a transform word w such that $w_P=p$, $w_J=d$, and $w_R=0$;
3) Compute $v=wG^{-1}$; and
4) Output $v_I$ as the modified data d' 503.

Proposition.

The data mapper in the preceding paragraph implements the data mapping operation as specified by Eq. (14); in other words, the output at step 4) satisfies $v_I=dD+a$ with $D=(G_{I,J})^{-1}$ and $a=-tG_{T,J}(G_{I,J})^{-1}$.

Proof.

The equation $v=wG^{-1}$ can be written as $$[v_T \; v_I \; v_C \; v_F] = \quad (20)$$

$$[w_P \; w_J \; w_R] \begin{bmatrix} (G_{T,P})^{-1} & -(G_{T,P})^{-1}G_{T,J}(G_{I,J})^{-1} & * & * \\ 0 & (G_{I,J})^{-1} & * & * \\ 0 & 0 & * & * \end{bmatrix}$$

This shows that $$v_I = -w_P(G_{T,P})^{-1}G_{T,J}(G_{I,J})^{-1}+w_J(G_{I,J})^{-1} \quad (21)$$

Recalling that $w_P=p$, $w_J=d$, and $tG_{T,P}=p$, Eq. (21) is equivalent to $$v_I=-p(G_{T,P})^{-1}G_{T,J}(G_{I,J})^{-1}+d(G_{I,J})^{-1}=-tG_{T,J}(G_{I,J})^{-1}+d(G_{I,J})^{-1}. \quad (22)$$

The proof is complete.

Remark:

The above proof makes it evident that the submatrices in Eq. (19) denoted by "*" play no role in this context.

The question that arises is whether there is any advantage to computing d' as part of a larger transform operation as in Eq. (20) instead of directly as in Eq. (14). It may appear that the calculation by Eq. (20) is more involved than Eq. (14) since it involves operations on larger matrices. However, if $G^{-1}$ has a structure that can be exploited to simplify the calculations, then Eq. (20) can readily take advantage of this, while in Eq. (14) the derived matrix D may have no structure left that can readily be exploited. Present principles recognize that embedding the data mapping operation into a larger matrix operation may simplify the calculations significantly.

In this third embodiment, once the modified data d' 503 is computed by a data mapper, it is provided as input to the non-systematic polar encoder 520, which may be any given encoder or implemented directly as discussed in connection with the first embodiment above. The exact nature of how the non-systematic polar encoder 520 is implemented is a side issue for present purposes. Present principles are directed primarily at providing an implementation of the data mapper 510 at low-complexity.

A class of codes that can benefit readily from present principles is the class of polar codes [Arik1]. In the case of polar codes, the transform matrix is of the form $G=F^{\otimes n}$ where F=

$$F = \begin{bmatrix} 1 & 0 \\ 1 & 1 \end{bmatrix}$$

is called the "kernel" of the construction. The following properties of the polar transform are well known [Arik1]. The transform matrix has elements $G_{i,j}$ such that $G_{i,j}=1$ if $i \succ j$ and $G_{i,j}=0$ otherwise. The inverse transform $G^{-1}$ equals G, and for any given u, the forward transform uG and its inverse $uG^{-1}$ can be computed using order N log N logic operations.

Figure 6:
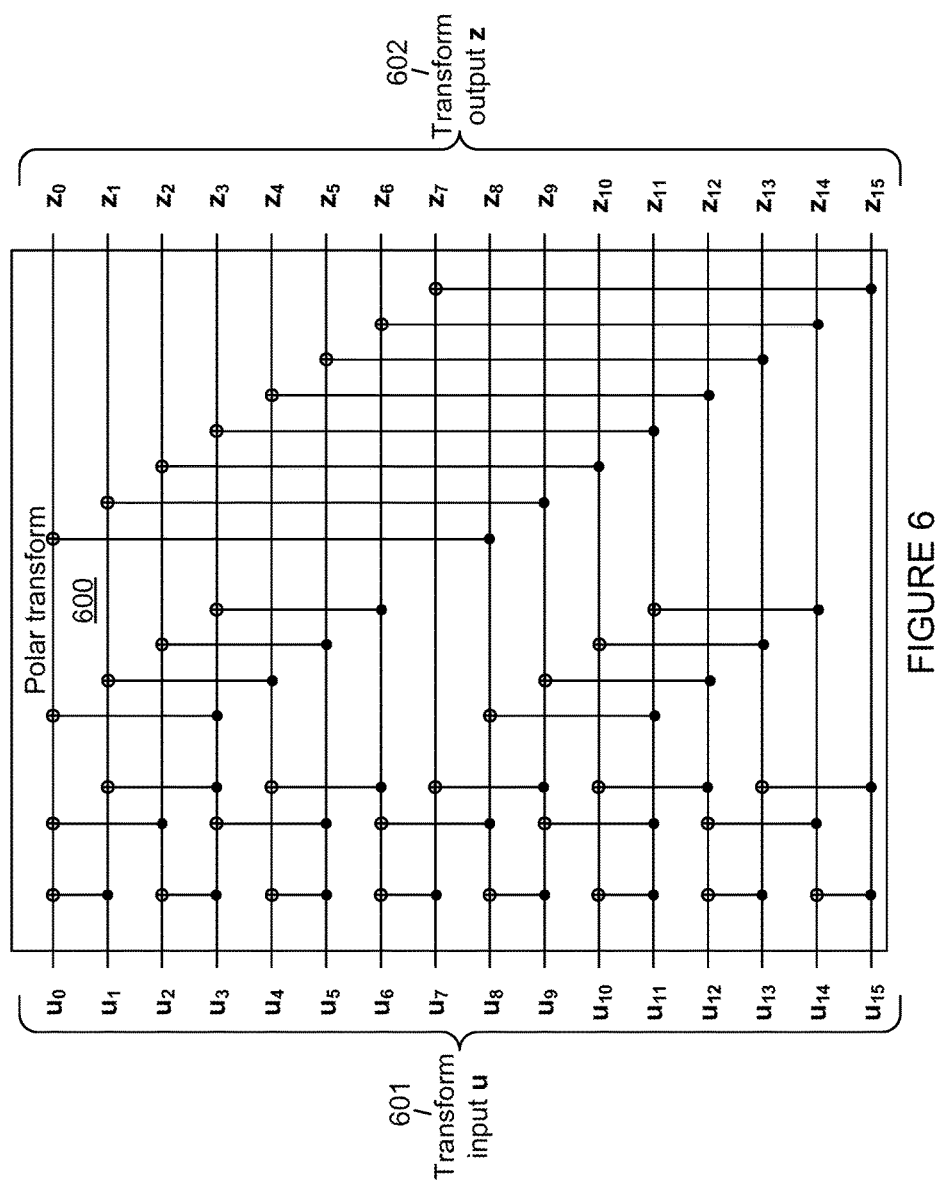
FIG. 6 illustrates a polar transform matrix G by which a transform input word u is multiplied to render a transform output z, i.e., z=uG.

Turning to FIG. 6, a polar transform 600 is shown. The polar transform 600 is a logic circuit implementing the polar transform $G=F^{\otimes n=4}$, which has the following 16-by-16 matrix representation:

$$G = F^{\otimes 4} = \begin{bmatrix} 1 & 0 & 0 & 0 & 0 & 0 & 0 & 0 & 0 & 0 & 0 & 0 & 0 & 0 & 0 & 0 \\ 1 & 1 & 0 & 0 & 0 & 0 & 0 & 0 & 0 & 0 & 0 & 0 & 0 & 0 & 0 & 0 \\ 1 & 0 & 1 & 0 & 0 & 0 & 0 & 0 & 0 & 0 & 0 & 0 & 0 & 0 & 0 & 0 \\ 1 & 1 & 1 & 1 & 0 & 0 & 0 & 0 & 0 & 0 & 0 & 0 & 0 & 0 & 0 & 0 \\ 1 & 0 & 0 & 0 & 1 & 0 & 0 & 0 & 0 & 0 & 0 & 0 & 0 & 0 & 0 & 0 \\ 1 & 1 & 0 & 0 & 1 & 1 & 0 & 0 & 0 & 0 & 0 & 0 & 0 & 0 & 0 & 0 \\ 1 & 0 & 1 & 0 & 1 & 0 & 1 & 0 & 0 & 0 & 0 & 0 & 0 & 0 & 0 & 0 \\ 1 & 1 & 1 & 1 & 1 & 1 & 1 & 1 & 0 & 0 & 0 & 0 & 0 & 0 & 0 & 0 \\ 1 & 0 & 0 & 0 & 0 & 0 & 0 & 0 & 1 & 0 & 0 & 0 & 0 & 0 & 0 & 0 \\ 1 & 1 & 0 & 0 & 0 & 0 & 0 & 0 & 1 & 1 & 0 & 0 & 0 & 0 & 0 & 0 \\ 1 & 0 & 1 & 0 & 0 & 0 & 0 & 0 & 1 & 0 & 1 & 0 & 0 & 0 & 0 & 0 \\ 1 & 1 & 1 & 1 & 0 & 0 & 0 & 0 & 1 & 1 & 1 & 1 & 0 & 0 & 0 & 0 \\ 1 & 0 & 0 & 0 & 1 & 0 & 0 & 0 & 1 & 0 & 0 & 0 & 1 & 0 & 0 & 0 \\ 1 & 1 & 0 & 0 & 1 & 1 & 0 & 0 & 1 & 1 & 0 & 0 & 1 & 1 & 0 & 0 \\ 1 & 0 & 1 & 0 & 1 & 0 & 1 & 0 & 1 & 0 & 1 & 0 & 1 & 0 & 1 & 0 \\ 1 & 1 & 1 & 1 & 1 & 1 & 1 & 1 & 1 & 1 & 1 & 1 & 1 & 1 & 1 & 1 \end{bmatrix}.$$

The polar transform 600 receives a transform input u 601 and outputs a transform output z 602. The transform input u

601 and the transform output z 602 are signals consisting of 16 Boolean variables which may be implemented using standard logic gates. The polar transform 600 operates using standard digital logic circuitry and comprises exclusive-or gates as the main data processing elements. The computation carried out by the polar transform is equivalent to the matrix operation z=uG in the binary field $F_2$.

While still looking at FIG. 6, an example will be given to illustrate the second and third embodiments described above.

Example

Consider a systematic polar encoder as in FIG. 5. Suppose the non-systematic polar encoder 520 is a non-systematic polar encoder of the type shown in FIG. 4 with transform matrix $G=F^{\otimes 4}$.

Suppose that the input partition (F, C, I, T) and the output partition (P, J, R) are specified as follows:

$T=P=(7,11,15)=(0111,1011,1111)$ $I=J=(3,12,13,14)=(0011,1100,1101,1110)$ $C=(6,9,10)=(0110,1001,1010)$ $F=(0,1,2,4,5,8)=(0000,0001,0010,0100,0101,1000)$ $R=(F,C)=(0,1,2,4,5,8,6,9,10)=(0000,0001,0010,0100,$
$0101,1000,0110,1001,1010)$

In writing the partition elements, the binary representations of the indices have also been given in order to facilitate checking if $G_{i,j}=1$. (Recall that $G_{i,j}=1$ if and only if $i \succ j$ holds.)

Some submatrices of G that are of interest for the present example are $$G_{T,P} = \begin{bmatrix} 1 & 0 & 0 \\ 0 & 1 & 0 \\ 1 & 1 & 1 \end{bmatrix}, G_{I,J} = \begin{bmatrix} 1 & 0 & 0 & 0 \\ 0 & 1 & 0 & 0 \\ 0 & 1 & 1 & 0 \\ 0 & 1 & 0 & 1 \end{bmatrix}, G_{T,J} = \begin{bmatrix} 1 & 0 & 0 & 0 \\ 1 & 0 & 0 & 0 \\ 1 & 1 & 1 & 1 \end{bmatrix}.$$

Note that $G_{T,P}$ and $G_{I,J}$ are invertible, as required by Design Rule 2.

Note also that $G_{I,P}=0$, $G_{C,P}=0$, $G_{F,P}=0$, $G_{C,J}=0$, and $G_{F,J}=0$.

Thus, the design choices in this example satisfy all requirements of Design Rule 2.

Conformance to Design Rule 2 is facilitated by some general properties of the transform $G=F^{\otimes n}$. Specifically, the invertibility of the submatrices $G_{T,P=T}$ and $G_{I,J}=1$ is due to the general property that $G_{A,A}$ is invertible for any non-empty A. The fact that $G_{I,P}=0$ is due to the fact that no element in I dominates any element in P. The same explanation holds for $G_{C,P}=0$, $G_{F,P}=0$, $G_{C,J}=0$, and $G_{F,J}=0$.

It should be clear from the preceding discussion how to select the input partition (F, C, I, T) and the output partition (P, J, R) so that Design Rule 2 will be valid in general with $G=F^{\otimes n}$ for any integer $n \geq 1$.

Continuing with the example, let b=(0, 1, 1, 0, 1, 0), p=(1, 1, 0), and $u_c$ be given by the linear function $$u_C = u_I \begin{bmatrix} 1 & 0 & 0 \\ 1 & 1 & 0 \\ 1 & 0 & 1 \\ 1 & 1 & 1 \end{bmatrix}.$$

The inverse puncture word t is computed as $$t = p(G_{T,P})^{-1} = (1,1,0)\begin{bmatrix} 1 & 0 & 0 \\ 0 & 1 & 0 \\ 1 & 1 & 1 \end{bmatrix}^{-1} = (1,1,0)\begin{bmatrix} 1 & 0 & 0 \\ 0 & 1 & 0 \\ 1 & 1 & 1 \end{bmatrix} = (1,1,0).$$

In the second embodiment, the data mapper takes the form $$d' = (d - tG_{T,J})(G_{I,J})^{-1} =$$

$$\left(d - (1,1,0)\begin{bmatrix} 1 & 0 & 0 & 0 \\ 1 & 0 & 0 & 0 \\ 1 & 1 & 1 & 1 \end{bmatrix}\right)\begin{bmatrix} 1 & 0 & 0 & 0 \\ 0 & 1 & 0 & 0 \\ 0 & 1 & 1 & 0 \\ 0 & 1 & 0 & 1 \end{bmatrix} = d\begin{bmatrix} 1 & 0 & 0 & 0 \\ 0 & 1 & 0 & 0 \\ 0 & 1 & 1 & 0 \\ 0 & 1 & 0 & 1 \end{bmatrix}.$$

For example, if d=(1, 0, 1, 1), then d'=(1, 0, 1, 1).

In the third embodiment, the data mapper first assembles a w such that $w_P=p$, $w_J=d$, $w_R=0$, then computes $v=wG^{-1}$, and finally outputs $v_I$ as d'. For example, if d=(1, 0, 1, 1), then $w=(0,0,0,1,0,0,0,1,0,0,0,1,0,1,1,0),$ $v=wG^{-1}=(1,0,0,1,1,0,0,1,1,0,0,1,0,1,1,0),$ and $d'=v_I=(1,0,1,1).$ Turning to FIG. 7, a data mapper with partitioning 700 is depicted, which may be employed in place of the data mapper 310 of FIG. 3 or the data mapper 510 of FIG. 5. The data mapper with partitioning 700 receives a data d 701 and, within a data partitioner 710, partitions the data d 701 into data 1 $d^{(1)}$ 702 and data 2 $d^{(2)}$ 703. The data 1 $d^{(1)}$ 702 and data 2 $d^{(2)}$ 703 are respectively received by the data mapper 1 720 and data mapper 2 730, which in turn respectively output a modified data 1 $d'^{(1)}$ 704 and a modified data 2 $d'^{(2)}$ 705. The modified data 1 $d'^{(1)}$ 704 and modified data 2 $d'^{(2)}$ 705 are both received by a data combiner 740, which combines them to generate a modified data d' 706.

Figure 7:
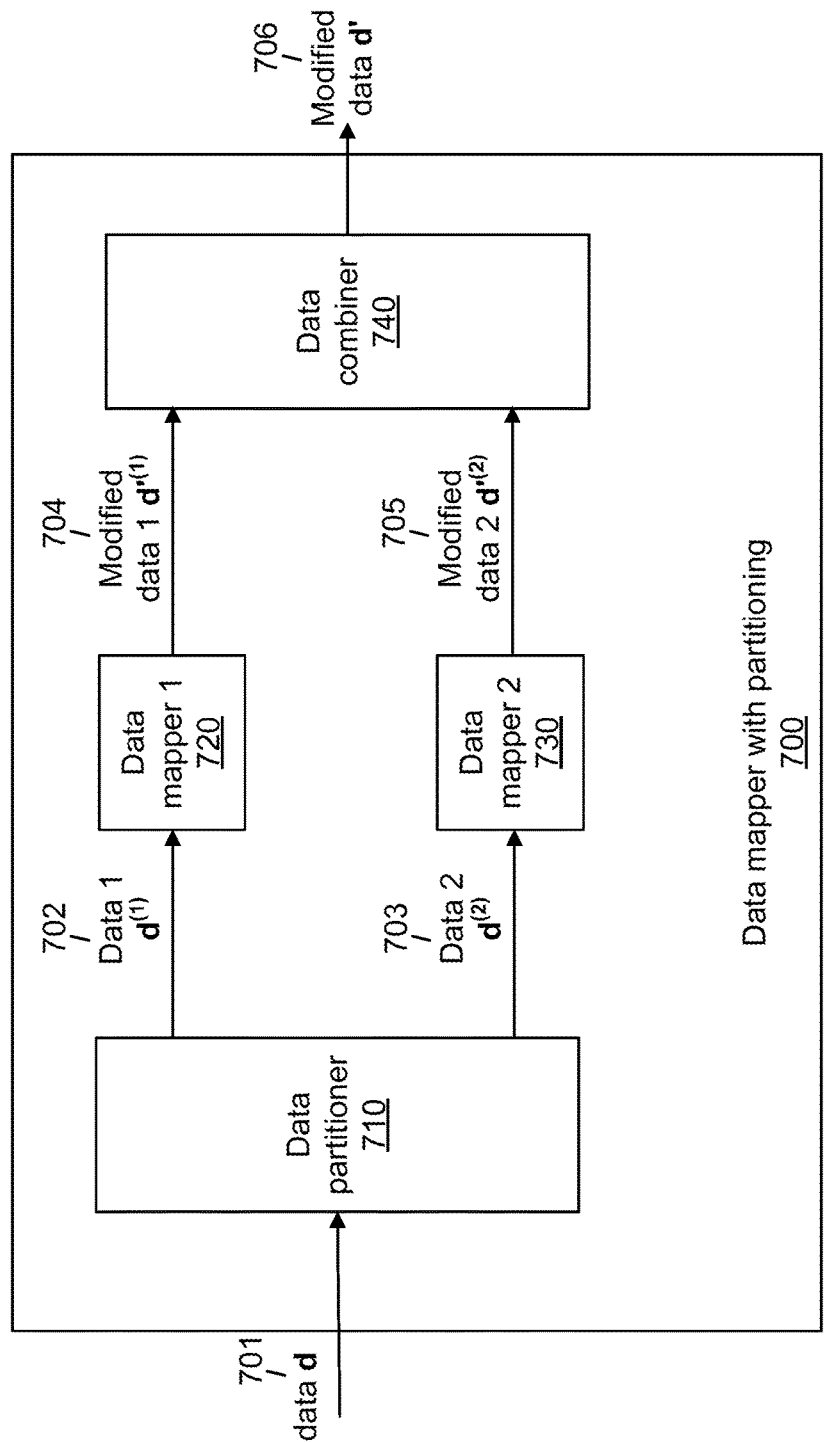
FIG. 7 depicts a data mapper with partitioning incorporated into systematic encoders according to embodiments of the present disclosure.

FIG. 7 presents a divide-and-conquer approach to implementing a data mapper. The data mapper 1 720 and the data mapper 2 730 each may be implemented using the same strategy as in FIG. 7, in a recursive fashion. Such a recursive implementation is the key to achieving order N log N complexity in implementing a systematic polar encoder in accordance with present principles.

The third embodiment above can utilize the recursive divide-and-conquer strategy of FIG. 7 when it is used with polar codes since in that case inverse transform $G^{-1}$ is given by a Kronecker power $G^{-1}=G=F^{\otimes n}$, and lends itself to the type of recursive circuit implementation given in FIG. 7.

FIG. 8 illustrates an example wireless network within which error correction using a low complexity systematic encoder in data transmission may be implemented according to this disclosure. The embodiment of the wireless network 800 shown in FIG. 8 is for illustration only. Other embodiments of the wireless network 800 could be used without departing from the scope of this disclosure. The wireless network 800 includes an eNodeB (eNB) 801, an eNB 802, and an eNB 803. The eNB 801 communicates with the eNB 802 and the eNB 803. The eNB 801 also communicates with at least one Internet Protocol (IP) network 830, such as the Internet, a proprietary IP network, or other data network.

Depending on the network type, other well-known terms may be used instead of "eNodeB" or "eNB," such as "base station" or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station" (or "MS"), "subscriber station" (or "SS"), "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

The eNB 802 provides wireless broadband access to the network 830 for a first plurality of user equipments (UEs) within a coverage area 820 of the eNB 802. The first plurality of UEs includes a UE 811, which may be located in a small business (SB); a UE 812, which may be located in an enterprise (E); a UE 813, which may be located in a WiFi hotspot (HS); a UE 814, which may be located in a first residence (R); a UE 815, which may be located in a second residence (R); and a UE 816, which may be a mobile device (M) like a cell phone, a wireless laptop, a wireless personal digital assistant (PDA), or the like. The eNB 803 provides wireless broadband access to the network 830 for a second plurality of UEs within a coverage area 825 of the eNB 803. The second plurality of UEs includes the UE 815 and the UE 816. In some embodiments, one or more of the eNBs 801-803 may communicate with each other and with the UEs 811-816 using 3G, 4G or 5G, long-term evolution (LTE), LTE-A, WiMAX, or other advanced wireless communication techniques.

Dotted lines show the approximate extents of the coverage areas 820 and 825, which are shown as approximately circular for the purposes of illustration and explanation only. It should be clearly understood that the coverage areas associated with eNBs, such as the coverage areas 820 and 825, may have other shapes, including irregular shapes, depending upon the configuration of the eNBs and variations in the radio environment associated with natural and man-made obstructions.

As described in more detail below, one or more of BS 801, BS 802 and BS 803 include 2D antenna arrays as described in embodiments of the present disclosure. In some embodiments, one or more of BS 801, BS 802 and BS 803 support the codebook design and structure for systems having 2D antenna arrays.

Although FIG. 8 illustrates one example of a wireless network 100, various changes may be made to FIG. 8. For example, the wireless network 800 could include any number of eNBs and any number of UEs in any suitable arrangement. Also, the eNB 801 could communicate directly with any number of UEs and provide those UEs with wireless broadband access to the network 830. Similarly, each eNB 802-803 could communicate directly with the network 830 and provide UEs with direct wireless broadband access to the network 830. Further, the eNB 801, 802, and/or 803 could provide access to other or additional external networks, such as external telephone networks or other types of data networks.

The example wireless transmit path 20 and receive path 40 depicted in FIG. 1 and described above may be implemented in an eNB (such as eNB 802) and/or a UE (such as UE 816), as described in further detail below.

Figure 9A:
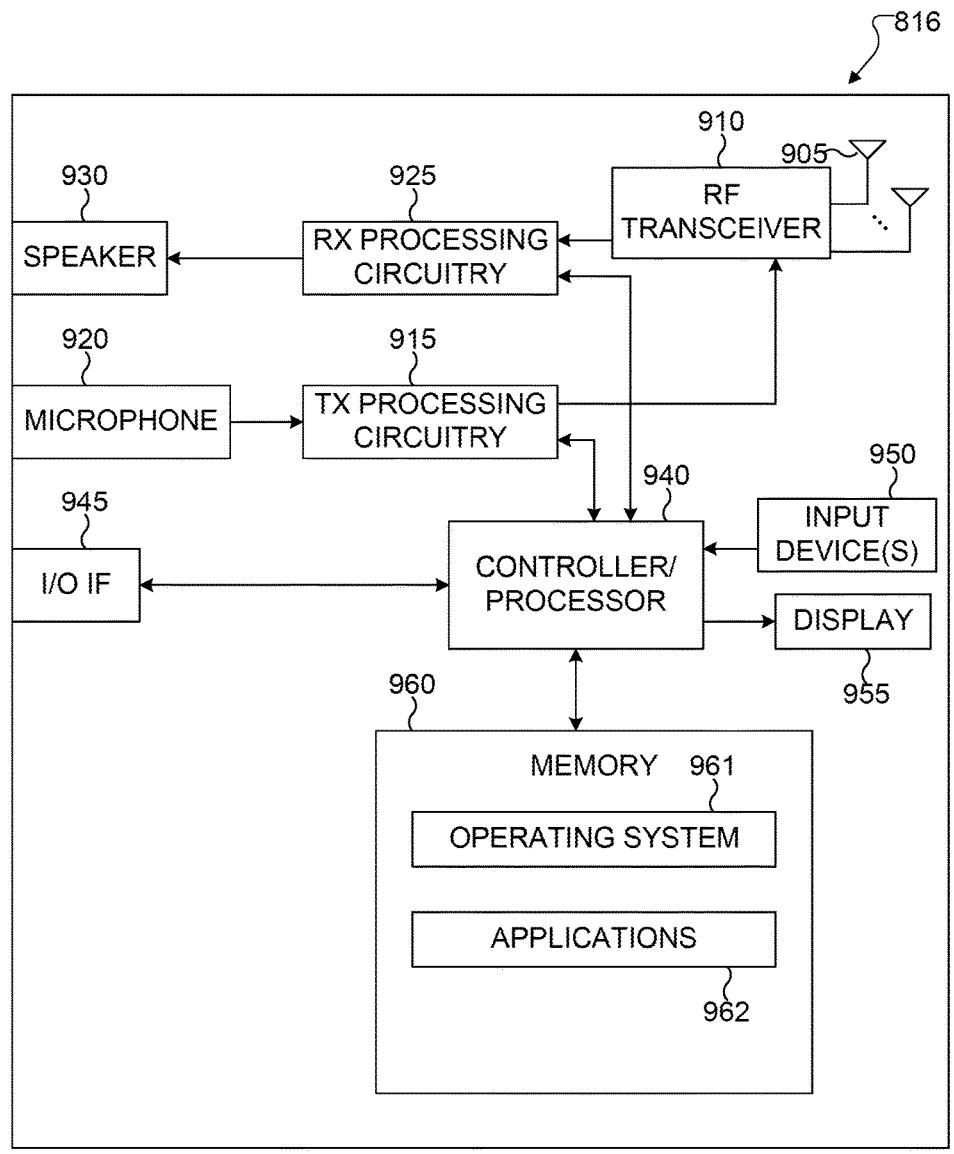
FIG. 9A illustrates an example user equipment network within which error correction using a low complexity systematic encoder in data transmission may be implemented according to this disclosure.

FIG. 9A illustrates an example user equipment network within which error correction using a low complexity systematic encoder in data transmission may be implemented according to this disclosure. The embodiment of the UE 816 illustrated in FIG. 9A is for illustration only, and the UEs 811-815 of FIG. 8 could have the same or similar configuration. However, UEs come in a wide variety of configurations, and FIG. 9A does not limit the scope of this disclosure to any particular implementation of a UE.

The UE 816 includes an antenna 905, a radio frequency (RF) transceiver 910, transmit (TX) processing circuitry 915 (which may be the transmit system 20 in FIG. 1), a microphone 920, and receive (RX) processing circuitry 925 (which may be receive system 40 in FIG. 1). The UE 816 also includes a speaker 930, a main processor 940, an input/output (I/O) interface (IF) 945, a keypad 950, a display 955, and a memory 960. The memory 960 includes a basic operating system (OS) program 961 and one or more applications 962. Either the OS program 961, one of the applications 962, or some combination thereof may implement programming for low complexity systematic polar encoding with error correction as described in the various embodiments of FIGS. 1 through 7.

The RF transceiver 910 receives, from the antenna 905, an incoming RF signal transmitted by an eNB of the network 800. The RF transceiver 910 may down-convert (e.g., within or in connection with demodulator 170) the incoming RF signal to generate an intermediate frequency (IF) or baseband signal which would be sent to the receive (Rx) processing circuitry 925 implementing channel decoder 180 and source decoder 190, which generates a processed signal by filtering, decoding, and/or digitizing the baseband or IF signal. The Rx processing circuitry 925 transmits the processed signal (including output data 195) to the speaker 930 (such as for voice data) or to the main processor 940 for further processing (such as for web browsing data).

The transmit (Tx) processing circuitry 915 receives, as at least some input data 110, analog or digital voice data from the microphone 920 or other outgoing baseband data (such as web data, e-mail, or interactive video game data) from the main processor 940. The Tx processing circuitry 915 implements source encoder 120 and channel encoder 130 to encode, multiplex, and/or digitize the outgoing data to generate a processed baseband or IF signal. The RF transceiver 910 receives the outgoing processed baseband or IF signal from the Tx processing circuitry 915 and up-converts (e.g., within or in connection with modulator 140) the baseband or IF signal to an RF signal that is transmitted via the antenna 905.

The main processor 940 can include one or more processors or other processing devices and execute the basic OS program 961 stored in the memory 960 in order to control the overall operation of the UE 816. For example, the main processor 940 could control the reception of forward channel signals and the transmission of reverse channel signals by the RF transceiver 910, the Rx processing circuitry 925, and the Tx processing circuitry 915 in accordance with well-known principles. In some embodiments, the main processor 940 includes at least one programmable microprocessor or microcontroller, while in other embodiments the main processor includes dedicated circuitry (e.g., for systemic and/or non-systematic encoding or decoding processes, puncturing processes, data mapping, etc.) as well as (optionally) programmable logic or processing circuits.

The main processor 940 is also capable of executing other processes and programs resident in the memory 960, such as operations for channel quality measurement and reporting for systems having 2D antenna arrays as described in embodiments of the present disclosure. The main processor 940 can move data and/or instructions into or out of the memory 960 as required by an executing process. In some embodiments, the main processor 940 is configured to execute the applications 962 based on the OS program 961 or in response to signals received from eNBs or an operator. The main processor 940 is also coupled to the I/O interface 945, which provides the UE 816 with the ability to connect to other devices such as laptop computers and handheld computers. The I/O interface 945 is the communication path between these accessories and the main controller 940.

The main processor 940 is also coupled to the keypad 950 (which may simply be a single button or may be an array or other set of buttons) and the display unit 955. The operator of the UE 816 can use the keypad 950 to enter data into the UE 816. The display 955 may be a touch screen display or other display capable of rendering text and/or at least limited graphics, such as from web sites, and receiving touch inputs by a user in accordance with known practices. The memory 960 is coupled to the main processor 940, and at least a part of the memory 960 could include a random access memory (RAM), and another part of the memory 960 could include a Flash memory or other read-only memory (ROM).

Although FIG. 9A illustrates one example of UE 816, various changes may be made to FIG. 9A. For example, various components in FIG. 9A could be combined, further subdivided, or omitted and additional components could be added according to particular needs. As a particular example, the main processor 940 could be divided into multiple processors, such as one or more central processing units (CPUs) and one or more graphics processing units (GPUs). Also, while FIG. 9A illustrates the UE 816 configured as a mobile telephone or smartphone, UEs could be configured to operate as other types of mobile or stationary devices.

Figure 9B:
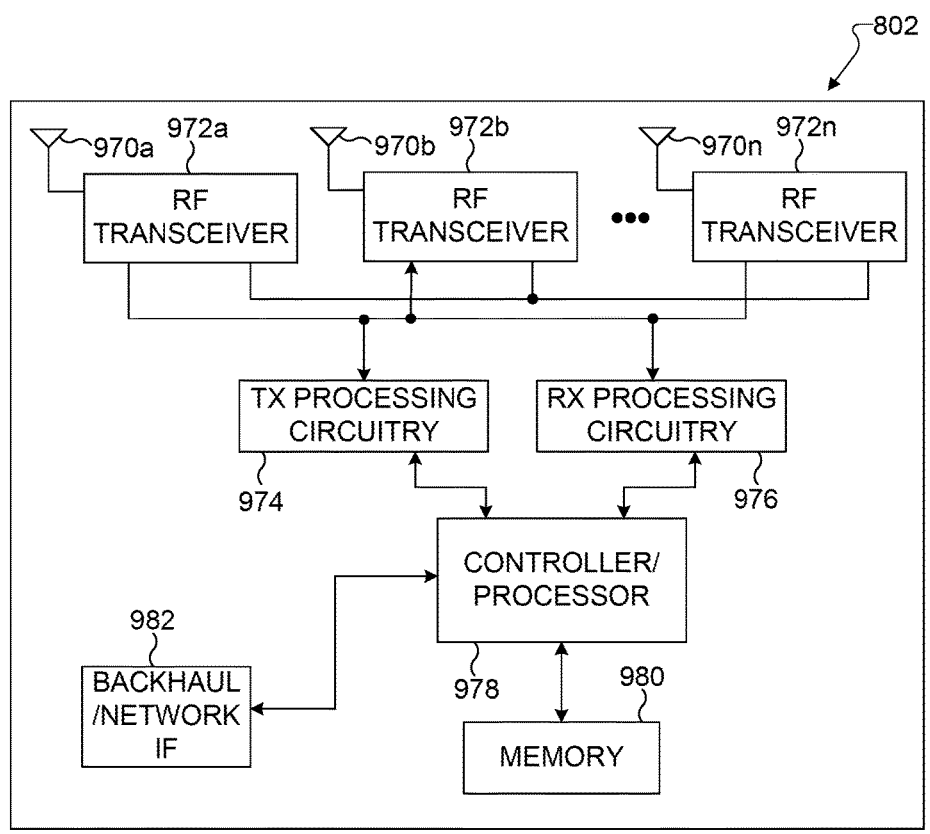
FIG. 9B illustrates an example enhanced NodeB (eNB) network within which error correction using a low complexity systematic encoder in data transmission may be implemented according to this disclosure.

FIG. 9B illustrates an example enhanced NodeB (eNB) network within which error correction using a low complexity systematic encoder in data transmission may be implemented according to this disclosure. The embodiment of the eNB 802 shown in FIG. 9B is for illustration only, and other eNBs of FIG. 8 could have the same or similar configuration. However, eNBs come in a wide variety of configurations, and FIG. 9B does not limit the scope of this disclosure to any particular implementation of an eNB. It is noted that eNB 801 and eNB 803 can include the same or similar structure as eNB 802.

As shown in FIG. 9B, the eNB 802 includes multiple antennas 970a-970n, multiple RF transceivers 972a-972n, transmit (Tx) processing circuitry 974, and receive (Rx) processing circuitry 976. In certain embodiments, one or more of the multiple antennas 970a-970n include 2D antenna arrays. The eNB 802 also includes a controller/processor 978, a memory 980, and a backhaul or network interface 982.

The RF transceivers 972a-972n receive, from the antennas 970a-970n, incoming RF signals, such as signals transmitted by UEs or other eNBs. The RF transceivers 972a-972n down-convert (e.g., within or in connection with demodulator 170) the incoming RF signals to generate IF or baseband signals. The IF or baseband signals are sent to the Rx processing circuitry 976 implementing channel decoder 180 and source decoder 190, which generates processed signals by filtering, decoding, and/or digitizing the baseband or IF signals. The Rx processing circuitry 976 transmits the processed signals (including output data 195) to the controller/processor 978 for further processing.

The Tx processing circuitry 974 receives, as at least some input data 110, analog or digital data (such as voice data, web data, e-mail, or interactive video game data) from the controller/processor 978. The Tx processing circuitry 974 implements source encoder 120 and channel encoder 130 to encode, multiplex, and/or digitize the outgoing baseband data to generate processed signals. The RF transceivers 972a-972n receive the outgoing processed signals from the Tx processing circuitry 974 and up-converts (e.g., within or in connection with modulator 140) the baseband or IF signals to RF signals that are transmitted via the antennas 970a-970n.

The controller/processor 978 can include one or more processors or other processing devices that control the overall operation of the eNB 802. For example, the controller/processor 978 could control the reception of forward channel signals and the transmission of reverse channel signals by the RF transceivers 972a-972n, the Rx processing circuitry 976, and the Tx processing circuitry 974 in accordance with well-known principles. The controller/processor 978 could support additional functions as well, such as more advanced wireless communication functions. Any of a wide variety of other functions could be supported in the eNB 802 by the controller/processor 978. In some embodiments, the controller/processor 378 includes at least one microprocessor or microcontroller, while in other embodiments the main processor includes dedicated circuitry (e.g., for systemic and/or non-systematic encoding processes, puncturing processes, data mapping, etc.) as well as (optionally) programmable logic or processing circuits.

The controller/processor 978 is also capable of executing programs and other processes resident in the memory 980, such as a basic OS. The controller/processor 978 is also capable of supporting channel quality measurement and reporting for systems having 2D antenna arrays as described in embodiments of the present disclosure. In some embodiments, the controller/processor 978 supports communications between entities. The controller/processor 878 can move data and/or instructions into or out of the memory 980 as required by an executing process.

The controller/processor 978 is also coupled to the backhaul or network interface 982. The backhaul or network interface 982 allows the eNB 802 to communicate with other devices or systems over a backhaul connection or over a network. The interface 982 could support communications over any suitable wired or wireless connection(s). For example, when the eNB 802 is implemented as part of a cellular communication system (such as one supporting 3G, 4G, 5G, LTE, or LTE-A), the interface 982 could allow the eNB 802 to communicate with other eNBs over a wired or wireless backhaul connection. When the eNB 802 is implemented as an access point, the interface 982 could allow the eNB 802 to communicate over a wired or wireless local area network or over a wired or wireless connection to a larger network (such as the Internet). The interface 982 includes any suitable structure supporting communications over a wired or wireless connection, such as an Ethernet or RF transceiver.

The memory 980 is coupled to the controller/processor 978. Part of the memory 980 could include a RAM, and another part of the memory 980 could include a Flash memory or other ROM. In certain embodiments, a plurality of instructions is stored in memory. The plurality of instructions are configured to cause the controller/processor 978 to perform the systemic and/or non-systematic encoding or decoding processes, puncturing processes, data mapping, etc.

Although FIG. 9B illustrates one example of an eNB 802, various changes may be made to FIG. 9B. For example, the eNB 802 could include any number of each component shown. As a particular example, an access point could include a number of interfaces 982, and the controller/processor 978 could support routing functions to route data between different network addresses. As another particular example, while shown as including a single instance of Tx processing circuitry 974 and a single instance of Rx processing circuitry 976, the eNB 802 could include multiple instances of each (such as one per RF transceiver).

While the particular METHOD AND SYSTEM FOR ERROR CORRECTION IN TRANSMITTING DATA USING LOW COMPLEXITY SYSTEMATIC ENCODER is herein described in detail and is depicted in the drawings, it is to be understood that the subject matter which is encompassed by the present disclosure is limited only by the claims. Although the present disclosure has been described with exemplary embodiments, various changes and modifications may be suggested to one skilled in the art. It is intended that the present disclosure encompass such changes and modifications that fall within the scope of the appended claims. The description in the present application should not be read as implying that any particular element, step, or function is an essential or critical element which must be included in the claim scope: the scope of patented subject matter is defined only by the allowed claims. Moreover, none of these claims are intended to invoke 35 USC § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

What is claimed is:

1. A systematic polar encoder with data checks in a transmission system, comprising:
   an input configured to receive an input data word d containing information to be transmitted;
   an encoder circuit configured to produce a codeword x such that an encoding operation by the encoder circuit utilizes
      a transform matrix G, and
      a transform input u that includes
         a part $u_F$ satisfying $u_F=b$ for a fixed word b that is independent of the data word d,
         a part $u_T$ satisfying $u_T=t$ for an inverse puncture word t that is a fixed word independent of the data word d,
         a part $u_I$ satisfying $u_I=d'$ for a modified data word d' that is derived from the data d, and
         a part $u_C$ satisfying $u_C=f(d')$ where f is a check generator function that operates on the modified data word d' and generates a non-void check word, the transform input u having associated with it a transform output z,
      wherein the transform output z is related to the transform input u by z=uG, the transform output z including
         a punctured part $z_P$ satisfying $z_P=p$ for a puncture word p that is one of a void fixed word and a non-void fixed word,
         a part $z_J$ satisfying $z_J=d$, and
         a part $z_R$ serving as redundant symbols,
      wherein systematic encoding of the data word d is achieved by combining the part $z_J=d$ and the part $z_R$ of the transform output z in a predetermined order to form the codeword x; and
   an output in the transmission system for transmission of the codeword x.

2. The systematic polar encoder with data checks according to claim 1, wherein the encoding operation comprises forming a vector w with $w_T=t$, $w_J=d$ and $w_R=e$ for some arbitrary word e, computing $v=wG^{-1}$, and obtaining the modified data word d' by setting $d'=v_I$.

3. The systematic polar encoder with data checks according to claim 1, wherein the transform matrix G has a form $A(F_1 \otimes G_1)B^T$, wherein A is a permutation matrix, $F_1$ is a first kernel transform, $G_1$ is a first-tier transform, B is a permutation matrix, the first kernel transform $F_1$ has a size greater than one, the first-tier transform has a size smaller than a size of the transform G, and the computation of v is simplified by taking advantage of the special structure of G.

4. The systematic polar encoder with data checks according to claim 3, wherein the first-tier transform $G_1$ is the Kronecker product of a plurality of kernel transforms: $G_1=F_2 \otimes \ldots \otimes F_n$, wherein each of the plurality of kernel transforms has a size greater than one.

5. The systematic polar encoder with data checks according to claim 4, wherein $F_i=F_1$, for all $2 \le i \le n$.

6. The systematic polar encoder with data checks according to claim 5, wherein $$F_1 = \begin{bmatrix} 1 & 0 \\ 1 & 1 \end{bmatrix}.$$

7. The systematic polar encoder with data checks according to claim 6, wherein A or B is the identity matrix.

8. A systematic polar encoder with data checks in a transmission system, comprising:
   a data mapper configured to receive an input data word d containing information to be polar coded for transmission and generate a modified data word d';
   a nonsystematic polar encoder configured to receive the modified data word d' and generate a transform output z for a codeword x, the nonsystematic polar encoder implementing a transform matrix G that encodes the modified data word d' to produce the transform output z for the codeword x such that, for some sub-sequence of coordinates S, $x_S=d$,
   wherein the transform matrix G is constrained by an input partition (F, C, I, T), where |C|>0, and an output partition (P, J, R) so that $G_{I,P}=0$, $G_{C,P}=0$, $G_{F,P}=0$, and $G_{T,P}$ is invertible; and
   a transceiver in the transmission system configured to transmit the codeword x.

9. The systematic polar encoder with data checks according to claim 8, further comprising:

a polar transform configured to implement a transform matrix G to produce a transform output z, wherein the systematic polar encoder is configured to determine the codeword x at least in part from the transform output z of the transform matrix G, wherein the transform output z comprises a punctured part $z_P$ satisfying $z_P$=p for a puncture word p, the puncture word p being independent of the data word d and one of a void fixed word and a non-void fixed word, a part $z_J$ serving to carry data corresponding to the input data word d, and a part $z_R$ serving as redundant symbols to protect the carried data, the part $z_J$ and the part $z_R$ combined in a predetermined order to form the codeword x.

10. The systematic polar encoder with data checks according to claim 9, wherein a transform input u for the transform matrix G, related to the transform output z by $u=zG^{-1}$, has a part $u_F$ satisfying $u_F$=b for a frozen word b that is a fixed word independent of the data word d, a part $u_C$ comprising a data check c comprising an output of a check generator function f operating on the modified data word d' and having at least one element that depends on the modified data word d', a part $u_I$ comprising the modified data word d', and a part $U_T$ satisfying $u_T$=$p(G_{T,P})^{-1}$.

11. The systematic polar encoder with data checks according to claim 10, wherein the transform matrix G, the input partition (F, C, I, T), and the output partition (P, J, R) are selected such that the check generator function f is an affine function.

12. The systematic polar encoder with data checks according to claim 10, wherein the transform matrix G, the input partition (F, C, I, T), and the output partition (P, J, R) are selected such that $G_{I,J}$ is invertible, $G_{C,J}$=0, and $G_{F,J}$=0.

13. The systematic polar encoder with data checks according to claim 12, wherein the generator matrix G has a form $A(F_1 \otimes G_1)B^T$, wherein A is a permutation matrix, $F_1$ is a first kernel transform, $G_1$ is a first-tier transform, B is a permutation matrix, the first kernel transform $F_1$ has a size greater than one, the first-tier transform has a size smaller than a size of the transform G, and the computation of the transform output z is simplified by taking advantage of the special structure of G.

14. The systematic polar encoder with data checks according to claim 13, wherein the first-tier transform $G_1$ is the Kronecker product of a plurality of kernel transforms: $G_1 = F_2 \otimes \ldots \otimes F_n$, wherein each of the plurality of kernel transforms has a size greater than one.

15. The systematic polar encoder with data checks according to claim 14, wherein $F_i = F_1$, for all $2 \leq i \leq n$.

16. The systematic polar encoder with data checks according to claim 15, wherein $$F_1 = \begin{bmatrix} 1 & 0 \\ 1 & 1 \end{bmatrix}.$$

17. The systematic polar encoder with data checks according to claim 16, wherein A or B is the identity matrix.

18. A method for systematic polar encoding with data checks in a transmission system, comprising:

receiving an input data word d containing information to be polar coded for transmission at a data mapper;

generating a modified data word d' using the data mapper;

receiving the modified data word d' at a nonsystematic polar encoder;

generating, using the nonsystematic polar encoder, a transform output z for a codeword x by a transform matrix G that encodes the modified data word d' to produce the transform output z for the codeword x such that, for some sub-sequence of coordinates S, $x_S$=d, wherein the transform matrix G is constrained by an input partition (F, C, I, T), where |C|>0, and an output partition (P, J, R) so that $G_{I,P}$=0, $G_{C,P}$=0, $G_{F,P}$=0, and $G_{T,P}$ is invertible; and transmitting the codeword x using a transceiver in the transmission system.

19. The method according to claim 18, further comprising:

employing a polar transform implementing the transform matrix G to produce a transform output z, wherein the codeword x is determined at least in part from the transform output z, wherein the transform output z comprises a punctured part $z_P$ satisfying $z_P$=p for a puncture word p, the puncture word p being independent of the data word d and one of a void fixed word and a non-void fixed word, a part $z_J$ serving to carry data corresponding to the input data word d, and a part $z_R$ serving as redundant symbols to protect the carried data, the part $z_J$ and the part $z_R$ combined in a predetermined order to form the codeword x.

20. The method according to claim 19, wherein a transform input u for the transform matrix G, related to the transform output z by $u=zG^{-1}$, has a part $u_F$ satisfying $u_F$=b for a frozen word b that is a fixed word independent of the data word d, a part $u_C$ comprising a data check c comprising an output of a check generator function f operating on the modified data word d', and having at least one element that depends on the modified data word d', a part $u_I$ comprising the modified data word d', and a part $u_T$ satisfying $u_T$=$p(G_{T,P})$.

21. The method according to claim 20, wherein the transform matrix G, the input partition (F, C, I, T), and the output partition (P, J, R) are selected such that the check generator function f is an affine function.

22. The method according to claim 20, wherein the transform matrix G, the input partition (F, C, I, T), and the output partition (P, J, R) are selected such that $G_{I,J}$ is invertible, $G_{C,J}$=0, and $G_{F,J}$=0.

23. The method according to claim 22, wherein the transform matrix G has a form $A(F_1 \otimes G_1)B^T$, wherein A is a permutation matrix, $F_1$ is a first kernel transform, $G_1$ is a first-tier transform, B is a permutation matrix, the first kernel transform $F_1$ has a size greater than one, the first-tier transform has a size smaller than a size of the transform G, and the computation of the transform output z is simplified by taking advantage of the special structure of G.

24. The method according to claim 23, wherein the first-tier transform $G_1$ is the Kronecker product of a plurality of kernel transforms: $G_1 = F_2 \otimes \ldots \otimes F_n$, wherein each of the plurality of kernel transforms has a size greater than one.

25. The method according to claim 24, wherein $F_i = F_1$, for all $2 \leq i \leq n$.

26. The method according to claim 25, wherein $$F_1 = \begin{bmatrix} 1 & 0 \\ 1 & 1 \end{bmatrix}.$$

27. The method according to claim 26, wherein A or B is the identity matrix.

\* \* \* \* \*

UNITED STATES PATENT AND TRADEMARK OFFICE
CERTIFICATE OF CORRECTION

| | | |
|---|---|---|
| PATENT NO. | : 10,404,291 B2 | Page 1 of 1 |
| APPLICATION NO. | : 15/826335 | |
| DATED | : September 3, 2019 | |
| INVENTOR(S) | : Erdal Arikan | |

It is certified that error appears in the above-identified patent and that said Letters Patent is hereby corrected as shown below:

In the Specification

At Column 9, Line 18, please replace "system 20" with --medium 30--.

At Column 19, Line 8, before "or" please insert --"or BS"--.

At Column 19, Line 30, please replace "(R)" with --(R1)--.

At Column 19, Line 31, please replace "(R)" with --(R2)--.

At Column 19, Line 59, please replace "100" with --800--.

At Column 20, Line 4, please replace "transmit path" with --transmission system--.

At Column 20, Line 4, please replace "receive path" with --reception system--.

At Column 20, Line 19, please replace "transmit" with --transmission--.

At Column 20, Line 21, please replace "receive" with --reception--.

Signed and Sealed this
Twenty-fourth Day of August, 2021

Drew Hirshfeld
*Performing the Functions and Duties of the
Under Secretary of Commerce for Intellectual Property and
Director of the United States Patent and Trademark Office*